United States Patent
Shigemori et al.

(10) Patent No.: US 7,604,424 B2
(45) Date of Patent: Oct. 20, 2009

(54) SUBSTRATE PROCESSING APPARATUS

(75) Inventors: Kazuhito Shigemori, Kyoto (JP); Koji Kaneyama, Kyoto (JP); Akiko Harumoto, Kyoto (JP); Tadashi Miyagi, Kyoto (JP); Masashi Kanaoka, Kyoto (JP); Shuichi Yasuda, Kyoto (JP)

(73) Assignee: Sokudo Co., Ltd., Kyoto (JP)

( * ) Notice: Subject to any disclaimer, the term of this patent is extended or adjusted under 35 U.S.C. 154(b) by 581 days.

(21) Appl. No.: 11/472,780

(22) Filed: Jun. 22, 2006

(65) Prior Publication Data

US 2006/0291855 A1 Dec. 28, 2006

(30) Foreign Application Priority Data

Jun. 24, 2005 (JP) ............................ 2005-185762
Sep. 28, 2005 (JP) ............................ 2005-281599

(51) Int. Cl.
G03D 5/00 (2006.01)
G03B 27/52 (2006.01)
A47L 15/00 (2006.01)

(52) U.S. Cl. ........................ 396/611; 355/27; 355/30; 15/88.2; 134/902

(58) Field of Classification Search ................ 396/611; 355/27, 30; 414/953; 15/77, 88.2; 134/1, 134/1.3, 902
See application file for complete search history.

(56) References Cited

U.S. PATENT DOCUMENTS 5,729,856 A 3/1998 Jang et al.
6,264,748 B1 7/2001 Kuriki et al.
6,439,962 B1 * 8/2002 Ato ............................ 451/6
6,893,171 B2 5/2005 Fukutomi et al.
6,915,183 B2 7/2005 Iida et al.
2002/0189641 A1 * 12/2002 Sato ........................... 134/6
2004/0253091 A1 * 12/2004 Iida et al. ................... 414/935
2007/0177869 A1 8/2007 Yamamoto et al.

FOREIGN PATENT DOCUMENTS

| CN | 1356728 | 7/2002 |
| CN | 1926662 | 3/2007 |
| JP | 2003-197592 | 7/2003 |
| JP | 2003-324139 | 11/2003 |

(Continued)

OTHER PUBLICATIONS

English Translation for JP 2003-197592 (dated Jul. 11, 2003).*

(Continued)

Primary Examiner—Alan A Mathews
(74) Attorney, Agent, or Firm—Townsend and Townsend and Crew LLP

(57) ABSTRACT

A substrate processing apparatus comprises an indexer block, an edge-cleaning processing block, an anti-reflection film processing block, a resist film processing block, a development processing block, a resist cover film processing block, a resist cover film removal block, a cleaning/drying processing block and an interface block. An exposure device is arranged adjacent to the interface block of the substrate processing apparatus. In the exposure device, exposure processing is applied to a substrate by a liquid immersion method. In the edge-cleaning processing group in the edge-cleaning processing block, an edge of the substrate before exposure processing is cleaned.

26 Claims, 26 Drawing Sheets

FOREIGN PATENT DOCUMENTS

| | | |
|---|---|---|
| JP | 2005-197469 | 7/2005 |
| JP | 2005-294520 | 10/2005 |
| KR | 1999-023624 | 3/1999 |
| KR | 0175278 | 4/1999 |
| KR | 2004-0111070 | 12/2004 |
| WO | WO 99/49504 | 9/1999 |

OTHER PUBLICATIONS

Examination Report of Korean Application 10-2007-0079353, dated Sep. 20, 2007, and English Translation, 10 pages total.
Examination Report of Korean Application No. 10-2007-0079353, dated Jan. 11, 2008 and English Translation, 16 pages total.
U.S. Appl. No. 11/273,463.
U.S. Appl. No. 11/273,440.
U.S. Appl. No. 11/273,465.
U.S. Appl. No. 11/273,441.
U.S. Appl. No. 11/273,439.
U.S. Appl. No. 11/294,877.
U.S. Appl. No. 11/295,257.
U.S. Appl. No. 11/294,727.
U.S. Appl. No. 11/295,240.
U.S. Appl. No. 11/295,216.
U.S. Appl. No. 11/474,614.
U.S. Appl. No. 11/475,598.
Office Action of Chinese Application No. 2006100932302, dated Apr. 3, 2009, 5 pages.

* cited by examiner

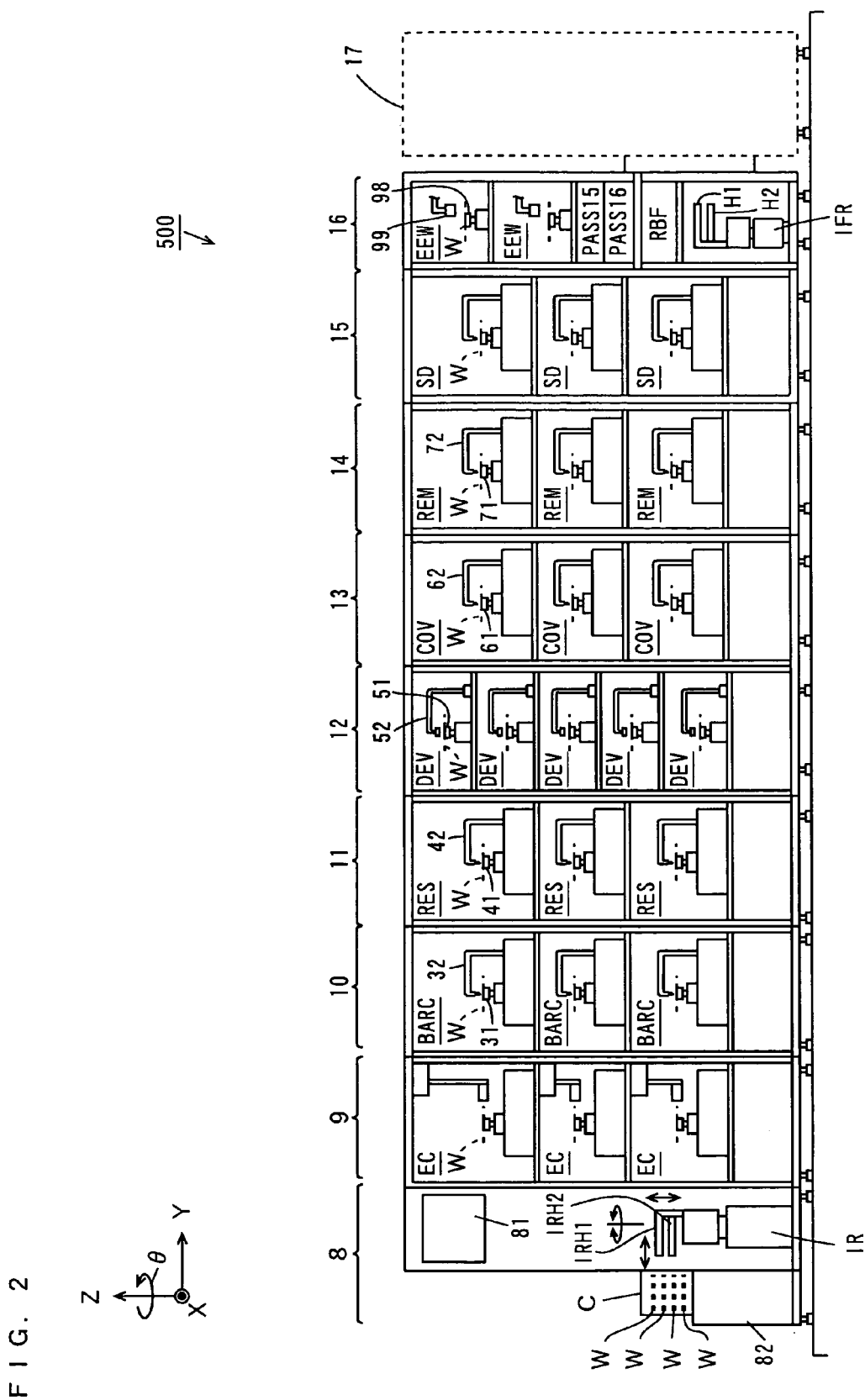
F I G. 2

F I G. 1 5
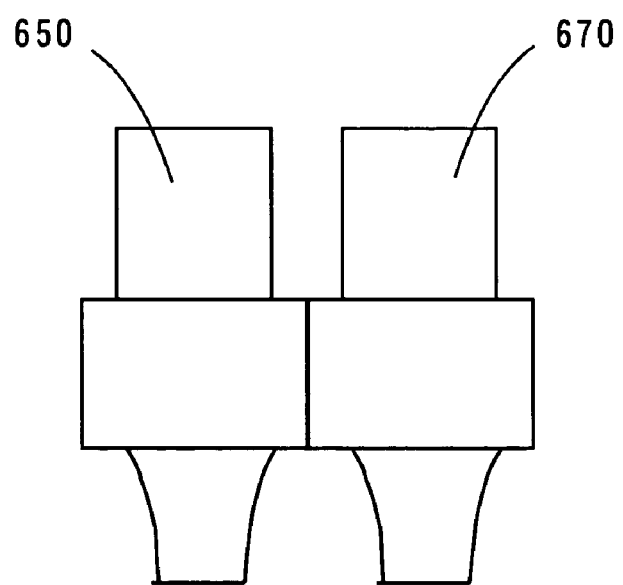

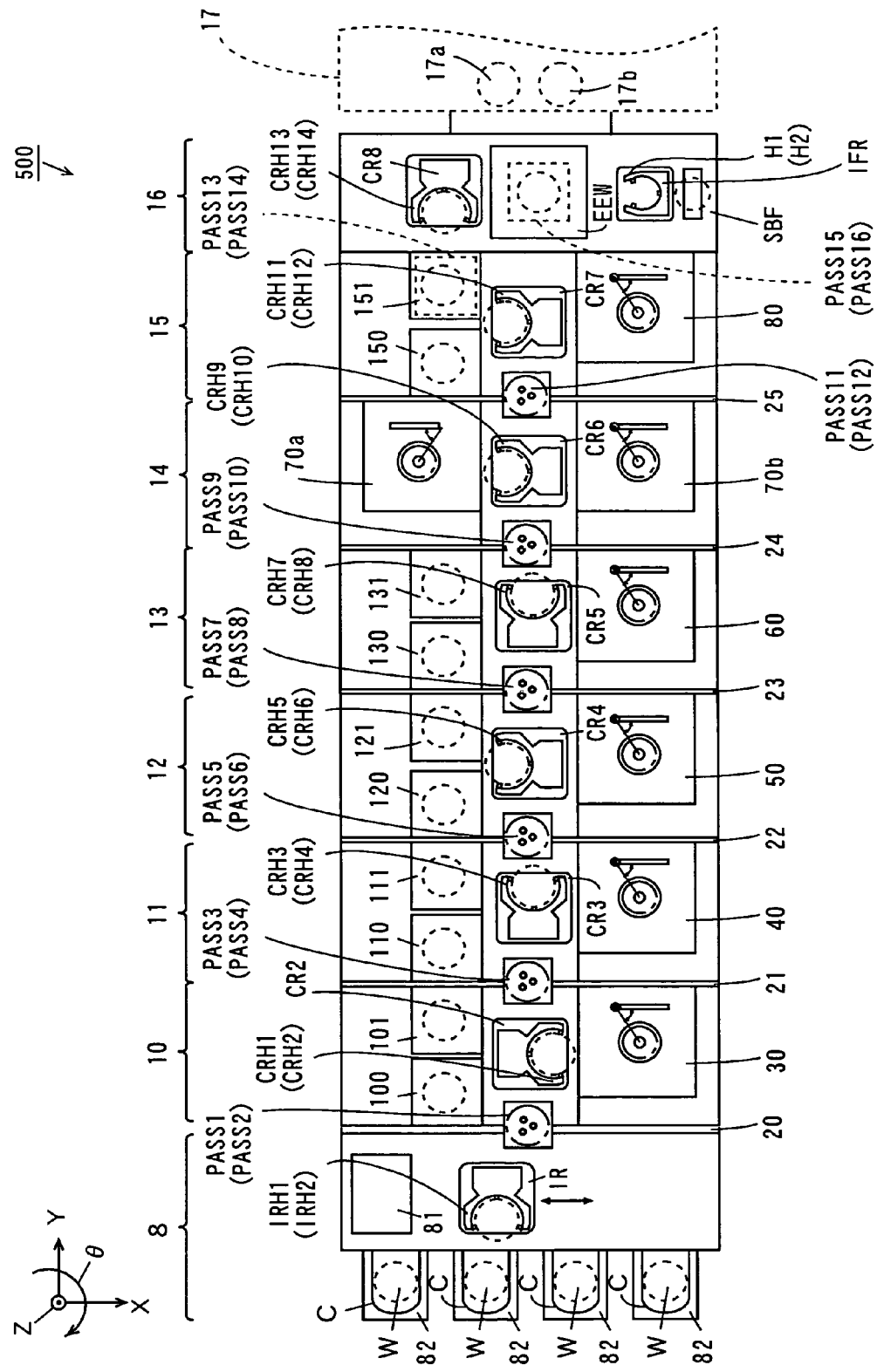
F I G. 2 1

SUBSTRATE PROCESSING APPARATUS

BACKGROUND OF THE INVENTION

1. Field of the Invention

The present invention relates to a substrate processing apparatus for applying processing to substrates.

2. Description of the Background Art

A substrate processing apparatus is used to apply a variety of processing to substrates such as semiconductor substrates, substrates for use in liquid crystal displays, plasma displays, optical disks, magnetic disks, magneto-optical disks, photomasks, and other substrates.

Such a substrate processing apparatus typically applies a plurality of successive processing to a single substrate. The substrate processing apparatus as described in JP 2003-324139 A includes an indexer block, an anti-reflection film processing block, a resist film processing block, a development processing block, and an interface block. An exposure device is arranged adjacent to the interface block as an external device separate from the substrate processing apparatus.

In the above-described substrate processing apparatus, a substrate is carried from the indexer block into the anti-reflection film processing block and the resist film processing block, where the formation of an anti-reflection film and resist film coating processing are applied to the substrate. The substrate is then transported to the exposure device through the interface block. After exposure processing has been applied to the resist film on the substrate by the exposure device, the substrate is transported to the development processing block through the interface block. In the development processing block, development processing is applied to the resist film on the substrate to form a resist pattern thereon, and the substrate is subsequently carried into the indexer block.

With recent improvements in the density and integration of devices, making finer resist patterns have become very important. Conventional exposure devices typically perform exposure processing by providing reduction projection of a reticle pattern on a substrate through a projection lens. With such conventional exposure devices, however, the line width of an exposure pattern is determined by the wavelength of the light source of an exposure device, thus making it impossible to make a resist pattern finer than that.

For this reason, a liquid immersion method is suggested as a projection exposure method allowing for finer exposure patterns (refer to, e.g., WO99/49504 pamphlet). In the projection exposure device according to the WO99/49504 pamphlet, a liquid is filled between a projection optical system and a substrate, resulting in a shorter wavelength of exposure light on a main surface of the substrate. This allows for a finer exposure pattern.

In the projection exposure device according to the aforementioned WO99/49504 pamphlet, exposure processing is performed with the substrate and the liquid being in contact with each other. Accordingly, if the contaminants adhere to the substrate before the exposure processing contaminants are mixed in the liquid.

Although a variety of film formation processing are applied to the substrate before the exposure processing, an edge of the substrate may be contaminated in the process of these film formation processing. If the exposure processing is applied to the substrate with the edge of the substrate contaminated, a lens of the exposure device is contaminated, possibly generating a defective dimension and a defective shape of the exposure pattern.

Also, in the above conventional substrate processing apparatus, the component included in an anti-reflection film, a resist film or the like at or around the edge of the substrate may be eluted or be extracted in an immersion liquid in the exposure processing by the liquid immersion method. Consequently, the lens of the exposure device may be contaminated, possibly generating a defective dimension and a defective shape of the exposure pattern.

SUMMARY OF THE INVENTION

It is an object of the invention to provide a substrate processing apparatus capable of preventing contamination in an exposure device and avoiding a defective dimension and a defective shape of an exposure pattern.

(1)

A substrate processing apparatus according to one aspect of the invention that is arranged adjacent to an exposure device includes a processing section for applying processing to a substrate, and an interface that is provided adjacent to an end of the processing section for exchanging the substrate between the processing section and the exposure device, wherein the processing section includes a first processing unit that cleans an edge of the substrate before exposure processing by the exposure device.

The substrate processing apparatus according to the invention is arranged adjacent to the exposure device. In the substrate processing apparatus, the processing section applies predetermined processing to the substrate and then the substrate is exchanged between the processing section and the exposure device by the interface adjacent to the end of the processing section.

In the processing section, the edge of the substrate before exposure processing by the exposure device is cleaned by the first processing unit. Thus, contaminants adhering to the edge of the substrate before the exposure processing can be removed. As a result, contamination inside the exposure device resulting from contamination of the edge of the substrate is prevented, which avoids a defective dimension and a defective shape of the exposure pattern.

(2)

The processing section may include a second processing unit that applies the predetermined processing to the substrate before the exposure processing by the exposure device and a third processing unit that applies the predetermined processing to the substrate after the exposure processing by the exposure device, wherein the first processing unit may clean the edge of the substrate before the processing by the second processing unit.

In this case, in the processing section, the predetermined processing is applied to the substrate before the exposure processing by the exposure device by the second processing unit while the predetermined processing is applied to the substrate after the exposure processing by the exposure device by the third processing unit.

The first processing unit cleans the edge of the substrate before the processing by the second processing unit, thereby preventing contaminants on the edge of the substrate from being transferred to a transport device for transporting the substrate among the second processing unit, the third processing unit and the exposure device.

In the second and the third processing units, the predetermined processing can be thus applied to the substrate in a clean state. Also, since the edge of the substrate is kept clean, a defective dimension of the substrate resulting from contamination of the edge of the substrate is sufficiently prevented.

(3)

The substrate processing apparatus may further include an indexer that is provided adjacent to another end of the processing section, carries in the substrate to the processing section and carries out the substrate from the processing section, the processing section may include a first processing block that includes the first processing unit and a first transport unit that transports the substrate, one or plurality of second processing blocks that each include the second processing unit and a second transport unit that transports the substrate, and one or plurality of third processing blocks that each include the third processing unit and a third transport unit that transports the substrate, wherein the first processing block may be arranged adjacent to the indexer.

In this case, the substrate is carried into the processing section by the indexer. In the first processing block of the processing section, the edge of the substrate carried from the adjacent indexer is cleaned by the first processing unit and the substrate is transported by the first transport unit.

In the second processing block of the processing section, the substrate before the exposure processing, the edge of which is cleaned by the first processing unit, is processed by the second processing unit and transported by the second transport unit.

In the third processing block of the processing section, the substrate after the exposure processing is processed by the third processing unit and transported by the third transport unit. The substrate processed by the third processing unit is then carried out of the processing section by the indexer.

This substrate processing apparatus has the structure in which the first processing block is added to an existing substrate processing apparatus having the second processing block, the third processing block and the indexer, thereby enabling prevention of contamination in the exposure device resulting from contamination of the edge of the substrate before the exposure processing at low cost.

(4)

The first processing block may further include a first platform where the substrate is mounted when the substrate is carried into the first processing block, and a second platform where the substrate is mounted when the substrate is carried out of the first processing block, and wherein the first transport unit may include first and second holders for holding the substrate, and the first transport unit may hold the substrate with the first holder when transporting the substrate from the first platform to the first processing unit and may hold the substrate with the second holder when transporting the substrate from the first processing unit to the second platform.

In the first processing block, the substrate carried therein is mounted on the first platform and then transported by the first holder of the first transport unit to the first processing unit. The substrate, the edge of which is cleaned by the first processing unit, is transported by the second holder of the first transport unit to the second platform. Subsequently, the substrate on the second platform is carried out of the processing block.

That is to say, the second holder is used when the substrate with its edge cleaned by the first processing unit is transported, while the first holder is used when the substrate with its edge uncleaned is transported. Therefore, contaminants adhering to the edge of the substrate are prevented from adhering to the second holder.

Accordingly, contaminants are prevented from adhering to the edge of the substrate before the exposure processing.

Consequently, contamination of the substrate before the exposure processing is avoided.

(5)

The first holder may be provided below the second holder. In this case, even if contaminants drop from the first holder and the edge of the substrate held thereby, the contaminants are prevented from adhering to the second holder and the substrate held thereby.

This reliably prevents contaminants from adhering to the substrate before the exposure processing. As a result, contamination of the substrate before the exposure processing is reliably avoided.

(6)

The third processing unit may include a drying processing unit that applies the drying processing to the substrate after the exposure processing by the exposure device, the third processing block including the drying processing unit may be arranged adjacent to the interface, the interface may include a fourth transport unit that transfers the substrate before the exposure processing to the exposure device, transports the substrate after the exposure processing from the exposure device to the drying processing unit and receives the substrate after the drying processing by the drying processing unit.

In this case, in the interface, the substrate before the exposure processing is transferred to the exposure device by the fourth transport unit and the substrate after the exposure processing is transported from the exposure device to the drying processing unit by the fourth transport unit.

In the drying processing unit included in the third processing block, the drying processing is applied to the substrate. After that, in the interface, the substrate dried by the drying processing unit is received by the fourth transport unit.

This prevents a liquid adhering to the substrate during the exposure processing by the exposure device from dropping in the substrate processing apparatus. As a result, operational troubles such as abnormalities in the electric system in the substrate processing apparatus can be prevented.

Also, applying the drying processing to the substrate after the exposure processing prevents particles and the like in the atmosphere from adhering to the substrate after the exposure processing, which avoids contamination of the substrate.

Further, since the transport of the substrate with a liquid avoided in the substrate processing apparatus, the liquid adhering to the substrate during the exposure processing can be prevented from influencing the atmosphere in the substrate processing apparatus. This facilitates adjustment of temperature and humidity in the substrate processing apparatus.

Additionally, it is possible to prevent the liquid adhering to the substrate during the exposure processing from adhering to another substrate before the exposure processing. Therefore, since particles and the like in the atmosphere can be prevented from adhering to other substrates before the exposure processing, degradation in resolution performance during the exposure processing as well as contamination in the exposure device can be reliably prevented.

As a result of the foregoing, defective processing of the substrate can be reliably prevented.

(7)

The fourth transport unit may include third and fourth holders for holding the substrate, the fourth transport unit may hold the substrate with the third holder when transferring the substrate before the exposure processing to the exposure device and when receiving the substrate after the drying processing by the drying processing unit, and may hold the substrate with the fourth holder when transporting the substrate after the exposure processing from the exposure device to the drying processing unit.

In this case, in the interface, the substrate before the exposure processing is held by the third holder of the fourth transport unit and transferred to the exposure device.

Also, the substrate after the exposure processing is held by the fourth holder of the fourth transport unit and transported from the exposure device to the drying processing unit.

Additionally, the substrate dried by the drying processing unit is held by the third holder of the fourth transport unit and received from the drying processing unit.

That is to say, the fourth holder is used for transporting the substrate with the liquid adhering during the exposure processing while the third holder is used for transporting the substrate without a liquid before the exposure processing and after the drying processing by the drying processing unit. Therefore, a liquid can be prevented from adhering to the third holder.

Accordingly, it is possible to prevent the liquid from adhering to the substrate before the exposure processing and after the drying processing by the drying processing unit. As a result, particles and the like in the atmosphere are prevented from adhering to the substrate after the exposure processing and after the drying processing by the drying processing unit.

(8)

The fourth holder may be provided below the third holder. Even if a liquid drops from the fourth holder and the substrate held thereby, this prevents the liquid from adhering to the third holder and the substrate held thereby.

This reliably prevents particles and the like from adhering to the substrate before the exposure processing. As a result, contamination of the substrate before the exposure processing is reliably avoided.

(9)

The second processing unit may include a photosensitive film formation unit that forms a photosensitive film made of a photosensitive material on the substrate. In this case, the photosensitive film made of the photosensitive material is formed by the photosensitive film formation unit on the substrate before the exposure processing with its edge cleaned.

In this case, since contaminants adhering to the edge of the substrate have been removed when the photosensitive film on the substrate, defective formation of the photosensitive film resulting from contamination of the edge of the substrate can be prevented, which avoids the generation of a defective dimension and a defective shape of the exposure pattern.

Additionally, since it is possible to clean the edge of the substrate and form the photosensitive film on the substrate in the single substrate processing apparatus, the footprint can be decreased.

(10)

The second processing unit may further include a protective film formation unit that forms a protective film for protecting the photosensitive film. In this case, since the protective film is formed on the photosensitive film, even if the exposure processing is performed with the substrate in contact with a liquid in the exposure device, the component of the photosensitive film can be prevented from being eluted in the liquid. This can reliably prevent contamination inside the exposure device.

(11)

The third processing unit may further include a removal unit that removes the protective film after the exposure processing by the exposure device. In this case, the protective film formed on the photosensitive film can be reliably removed.

(12)

The second processing unit may further include an anti-reflection film formation unit that forms an anti-reflection film on the substrate before the formation of the photosensitive film by the photosensitive film formation unit. In this case, since the anti-reflection film is formed on the substrate, potential standing waves and halation generated during the exposure processing can be reduced.

(13)

The third processing unit may include a development processing unit that applies development processing to the substrate. In this case, development processing is applied to the substrate by the development processing unit.

In this way, since it is possible to clean the edge of the substrate and apply the development processing to the substrate in the single substrate processing apparatus, the footprint can be decreased.

(14)

The first processing unit may clean the edge of the substrate using a brush. In this case, the edge of the substrate is cleaned by the brush in the first processing unit.

When the edge of the substrate is cleaned with the brush as described above, the brush comes in contact with the edge of the substrate, so that contaminants can be physically stripped from the edge of the substrate. This can reliably remove contaminants firmly adhering to the edge.

(15)

The first processing unit may clean the edge of the substrate using a two-fluid nozzle. In this case, the edge of the substrate is cleaned by the two-fluid nozzle in the first processing unit.

When the edge of the substrate is cleaned by the two-fluid nozzle, a fluid mixture of a gas and a liquid is discharged to the edge of the substrate, so that the edge of the substrate is cleaned.

In this way, high cleaning effects can be obtained by using the fluid mixture.

In addition, since the edge of the substrate is cleaned in a noncontacting method by discharging the fluid mixture to the edge, damage of the edge of the substrate is avoided during cleaning. In addition, it is possible to easily control the condition of cleaning the edge of the substrate by controlling the discharge pressure of the fluid mixture and the ratio of the gas to the liquid in the fluid mixture.

Moreover, since use of the two-fluid nozzle makes it possible to discharge uniform fluid mixture onto the edge of the substrate, non-uniform cleaning is avoided.

(16)

The first processing unit may clean the edge of the substrate using an ultrasonic nozzle. In this case, in the first processing unit, the edge of the substrate is cleaned by the ultrasonic nozzle.

When the edge of the substrate is cleaned with the ultrasonic nozzle, the high-frequency power corresponding to the value of high-frequency electric current is applied to the liquid passing through the ultrasonic nozzle.

In such a way, the liquid in a state of ultrasonic vibration is discharged to the edge of the substrate, so that the edge of the substrate is cleaned. In this case, it becomes possible to electrically control the high-frequency power applied to the liquid depending on the type of the substrate and the cleaning condition.

(17)

The substrate processing section may further include a second processing unit that forms a photosensitive film made of a photosensitive material on the substrate, and the first processing unit may clean the edge of the substrate before the exposure processing by the exposure device with a liquid used for the exposure processing by a liquid immersion method.

In the substrate processing apparatus, the substrate is transferred between the processing section and the exposure device by the interface. The photosensitive film made of the photosensitive material is formed on the substrate by the second processing unit.

In addition, in the first processing unit, the edge of the substrate before the exposure processing by the exposure device is cleaned by a liquid used for the exposure processing by the liquid immersion method. The component may be eluted or extracted from the photosensitive film during the exposure processing is eluted or extracted in advance in the first processing unit, and the eluted or extracted component is cleaned away. Therefore, during the exposure processing, the component of the photosensitive film is prevented from being eluted or extracted in the above a liquid. This prevents contamination of the exposure device. As a result, the generation of a defective dimension and a defective shape of the exposure pattern is avoided.

Note that a potential component that might be eluted or extracted in the above a liquid during the exposure processing is not limited to that included in the photosensitive film, which may be a component included in a semiconductor film, a metal film, a insulation film, or an organic film or the like formed on the substrate by an external device provided outside the substrate processing apparatus according to the invention. It is also possible to elute or extract a component included in such a film in the first processing unit in advance.

Furthermore, since it is possible to clean the edge of the substrate and form the photosensitive film on the substrate in the single substrate processing apparatus, the footprint can be decreased.

(18)

The processing section may further include a third processing unit that forms a protective film for protecting the photosensitive film formed by the second processing unit, and the third processing unit may clean the photosensitive film exposed on the edge of the substrate before the exposure processing using the liquid.

In this case, the photosensitive film formed on the substrate is protected by the protective film. Also, even if there is the exposed photosensitive film uncoated by the protective film on the edge of the substrate, the edge before the exposure processing is cleaned by the liquid used for the exposure processing by the liquid immersion method in the first processing unit. The component that may be eluted or extracted from the exposed photosensitive film during the exposure processing is eluted or extracted in advance in the first processing unit, and the eluted component or extracted component is cleaned away. Therefore, during the exposure processing, the component of the photosensitive film is prevented from being eluted or extracted in the above liquid. This prevents contamination of the exposure device. As a result, the generation of a defective dimension and a defective shape of the exposure pattern is prevented.

(19)

The processing section may further include a fourth processing unit that forms an anti-reflection film on the substrate before the formation of the photosensitive film by the second processing unit, and the first processing unit may clean one or both of the anti-reflection film and the photosensitive film exposed on the edge of the substrate before the exposure processing using the liquid.

In this case, since the anti-reflection film is formed on the substrate, it is possible to reduce potential standing waves and halation caused during the exposure processing. In addition, the edge of the substrate before the exposure processing by the exposure device is cleaned by the liquid used for the exposure processing by the liquid immersion method in the first processing unit. The component that may be eluted or extracted from one or both of the anti-reflection film and the photosensitive film during the exposure processing is eluted or extracted in advance in the first processing unit, and the eluted component or extracted component is cleaned away. Therefore, during the exposure processing, the component of one or both of the anti-reflection film and the photosensitive film is prevented from being eluted or extracted in the above a liquid. This prevents contamination of the exposure device. As a result, the generation of a defective dimension and a defective shape of the exposure pattern is prevented.

(20)

The liquid may include at least any one of pure water, glycerol and a mixture liquid of particles with a high refractive index and pure water. In this case, it is possible to perform the exposure processing by the liquid immersion method with the above a liquid well and clean the edge of the substrate well in the first processing.

(21)

The particles with a high refractive index may include aluminum oxide. In this case, the exposure processing by the liquid immersion method using the liquid including aluminum oxide can be well performed, and the edge of the substrate can be cleaned as well in the first processing unit.

(22)

The interface may include a transport device that transports the substrate between the processing section and the exposure device, and the transport device may include first and the second holders for holding the substrate, the transport device may hold the substrate with the first holder when transporting the substrate before the exposure processing and may hold the substrate with the second holder when transporting the substrate after the exposure processing.

In this case, the second holder is used for transporting the substrate with a liquid adhering thereto during the exposure processing, while the first holder is used for transporting the substrate with no liquid adhering before the exposure processing. This prevents the liquid from adhering to the first holder. Accordingly, the liquid is prevented from adhering to the substrate before the exposure processing. This can reliably prevent particles and the like in the atmosphere from adhering to the substrate before the exposure processing.

(23)

The second holder may be provided below the first holder. In this case, even if a liquid drops from the second holder and the substrate held thereby, the liquid is prevented from adhering to the first holder and the substrate held thereby. This reliably prevents particles and the like from adhering to the substrate before the exposure processing.

(24)

The processing section may further include a fifth processing unit that removes the protective film after the exposure processing. In this case, it is possible to reliably remove the protective film formed on the photosensitive film.

(25)

The processing section may further include a sixth processing unit that applies development processing to the substrate. In this case, the development processing is applied to the substrate by the sixth processing unit. This enables cleaning of the edge of the substrate and the development processing to the substrate in the single substrate processing apparatus, thereby reducing the footprint.

(26)

The first processing unit may include a two-fluid nozzle that discharges a fluid mixture of the liquid and a gas to the edge of the substrate.

In this case, the edge of the substrate is cleaned by the two-fluid nozzle in the first processing unit. When the edge of the substrate is cleaned by the two-fluid nozzle, the fluid mixture of the gas and the liquid is discharged to the edge of the substrate, so that the edge is cleaned. In this way, high cleaning effects can be obtained.

In addition, since the edge of the substrate is cleaned in a noncontacting manner by discharging the fluid mixture to the edge, damage of the edge of the substrate is prevented during cleaning. Further, it is possible to easily control the condition of cleaning the edge of the substrate by controlling the discharge pressure of the fluid mixture and the ratio of the gas and the liquid in the fluid mixture.

Moreover, since use of the two-fluid nozzle makes it possible to discharge uniform fluid mixture onto the edge of the substrate, non-uniform cleaning is avoided.

(27)

The first processing unit may include an ultrasonic nozzle that discharges the liquid to the edge of the substrate while providing an ultrasonic wave to the liquid.

In this case, in the first processing unit, the edge of the substrate is cleaned by the ultrasonic nozzle. When the edge of the substrate is cleaned with the ultrasonic nozzle, the high-frequency power corresponding to the value of high-frequency electric current is applied to the liquid passing through the ultrasonic nozzle. In such a way, the liquid in a state of ultrasonic vibration is discharged to the edge of the substrate, so that the edge is cleaned. In this case, it is possible to electrically control the high-frequency power applied to the liquid depending on the type of the substrate and cleaning conditions.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a side view of the substrate processing apparatus in FIG. 1 that is seen from the +X direction;

FIG. 15 is a schematic diagram showing another example of the nozzle for drying processing;

FIG. 21 is a schematic plan view of the substrate processing apparatus according to a second embodiment;

DESCRIPTION OF THE PREFERRED EMBODIMENTS

Substrate processing apparatuses according to embodiments of the invention will be described with reference to the drawings. A substrate as used in the description below includes a semiconductor substrate, a substrate for a liquid crystal display, a substrate for a plasma display, a glass substrate for a photomask, a substrate for an optical disk, a substrate for a magnetic disk, a substrate for a magneto-optical disk, and a substrate for a photomask. The substrate may be made of silicon (Si).

Also, the subsequent drawings are accompanied by the arrows that indicate X, Y, and Z directions perpendicular to one another for clarification of positions. The X and Y directions are perpendicular to each other in a horizontal plane, and the Z direction corresponds to the vertical direction. In each of the directions, the direction at which an arrow points is defined as + direction, and the opposite direction is defined as − direction. The rotation direction centered around the Z direction is defined as θ direction.

A. First Embodiment (1) Configuration of the Substrate Processing Apparatus

A substrate processing apparatus according to a first embodiment of the invention will be described with reference to the drawings.

Figure 1:
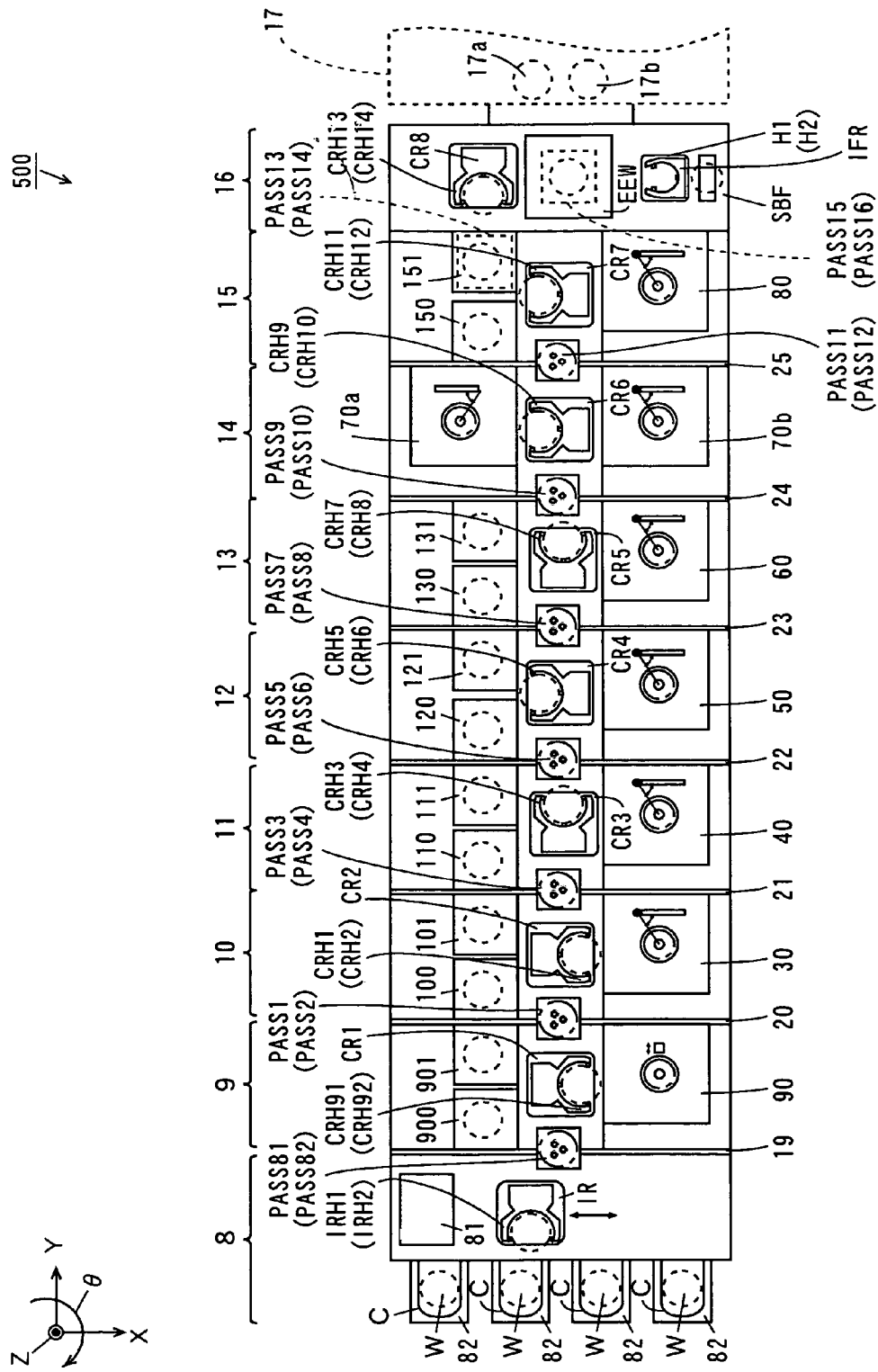
FIG. 1 is a schematic plan view of a substrate processing apparatus according to a first embodiment of the invention.

FIG. 1 is a schematic plan view of a substrate processing apparatus according to a first embodiment of the invention.

As shown in FIG. 1, a substrate processing apparatus 500 includes an indexer block 8, an edge-cleaning processing block 9, an anti-reflection film processing block 10, a resist film processing block 11, a development processing block 12, a resist cover film processing block 13, a resist cover film removal block 14, an cleaning/drying processing block 15 and an interface block 16. In the substrate processing apparatus 500, these blocks are provided in the above order.

An exposure device 17 is arranged adjacent to the interface block 16 of the substrate processing apparatus 500. The exposure device 17 applies the exposure processing to substrates W by a liquid immersion method.

The indexer block 8 includes a main controller (controller) 81 for controlling the operation of each block, a plurality of carrier platforms 82, and an indexer robot IR. The indexer robot IR has hands IRH1 and IRH2 provided one above the other for receiving and transferring the substrates W.

The edge-cleaning processing block 9 includes thermal processing groups 900, 901 for post edge-cleaning, a edge-cleaning processing group 90, and a first central robot CR1. The edge-cleaning processing group 90 is arranged opposite to the thermal processing groups 900, 901 with the first central robot CR1 therebetween. The first central robot CR1 has hands CRH1, CRH2 provided one above the other for receiving and transferring the substrates W.

A partition wall 19 is arranged between the indexer block 8 and the edge-cleaning processing block 9 for shielding an atmosphere. The partition wall 19 has substrate platforms PASS81, PASS82 provided closely one above the other for receiving and transferring the substrates W between the indexer block 8 and the edge-cleaning processing block 9. The upper substrate platform PASS81 is used in transferring the substrates W from the indexer block 8 to the edge-cleaning processing block 9, and the lower substrate platform PASS82 is used in transferring the substrates W from the edge-cleaning processing block 9 to the indexer block 8.

Each of the substrate platforms PASS81, PASS82 has an optical sensor (not shown) for detecting the presence or absence of a substrate W. This enables a determination to be made whether or not a substrate W is on the substrate platform PASS81, PASS82. In addition, each of the substrate platforms PASS81, PASS82 has a plurality of support pins secured thereto. Note that each of substrate platforms PASS1 to PASS16 mentioned below similarly has such an optical sensor and support pins.

The anti-reflection film processing block 10 includes thermal processing groups 100, 101 for anti-reflection film, a coating processing group 30 for anti-reflection film, and a second central robot CR2. The coating processing group 30 is arranged opposite to the thermal processing groups 100, 101 with the second central robot CR2 therebetween. The second central robot CR2 has hands CRH1, CRH2 provided one above the other for receiving and transferring the substrates W.

A partition wall 20 is arranged between the edge-cleaning processing block 9 and the anti-reflection film processing block 10 for shielding an atmosphere. The partition wall 20 has substrate platforms PASS1, PASS2 provided closely one above the other for receiving and transferring the substrates W between the edge-cleaning processing block 9 and the anti-reflection film processing block 10. The upper substrate platform PASS1 is used in transferring the substrates W from the edge-cleaning processing block 9 to the anti-reflection film processing block 10, and the lower substrate platform PASS2 is used in transferring the substrates W from the anti-reflection film processing block 10 to the edge-cleaning processing block 9.

The resist film processing block 11 includes thermal processing groups 110, 111 for resist film, a coating processing group 40 for resist film, and a third central robot CR3. The coating processing group 40 for resist film is arranged opposite to the thermal processing groups 110, 111 with the third central robot CR3 therebetween. The third central robot CR3 has hands CRH3, CRH4 provided one above the other for receiving and transferring the substrates W.

A partition wall 21 is arranged between the anti-reflection film processing block 10 and the resist film processing block 11 for shielding an atmosphere. The partition wall 21 has substrate platforms PASS3, PASS4 provided closely one above the other for receiving and transferring the substrates W between the anti-reflection film processing block 10 and the resist film processing block 11. The upper substrate platform PASS3 is used in transferring the substrates W from the anti-reflection film processing block 10 to the resist film processing block 11. The lower substrate platform PASS4 is used in transferring the substrates W from the resist film processing block 11 to the anti-reflection film processing block 10.

The development processing block 12 includes thermal processing groups 120, 121 for development, a development processing group 50, and a fourth central robot CR4. The development processing group 50 is arranged opposite to the thermal processing groups 120, 121 for development with the fourth central robot CR4 therebetween. The fourth central robot CR4 has hands CRH5, CRH6 provided one above the other for receiving and transferring the substrates W.

A partition wall 22 is arranged between the resist film processing block 11 and the development processing block 12 for shielding an atmosphere. The partition wall 22 has substrate platforms PASS5, PASS6 provided closely one above the other for receiving and transferring the substrates W between the resist film processing block 11 and the development processing block 12. The upper substrate platform PASS5 is used in transferring the substrates W from the resist film processing block 11 to the development processing block 12, and the lower substrate platform PASS6 is used in transferring the substrates W from the development processing block 12 to the resist film processing block 11.

The resist film processing block 13 includes thermal processing groups 130, 131 for resist cover film, a coating processing group 60 for resist cover film, and a fifth central robot CR5. The coating processing group 60 for resist cover film is arranged opposite to the thermal processing groups 130, 131 with the fifth central robot CR5 therebetween. The fifth central robot CR5 has hands CRH7, CRH8 provided one above the other for receiving and transferring the substrates W.

A partition wall 23 is arranged between the development processing block 12 and the resist cover film processing block 13 for shielding an atmosphere. The partition wall 23 has substrate platforms PASS7, PASS8 provided closely one above the other for receiving and transferring the substrates W between the development processing block 12 and the resist cover film processing block 13. The upper substrate platform PASS7 is used in transferring the substrates W from the development processing block 12 to the resist cover film processing block 13, and the lower substrate platform PASS8 is used in transferring the substrates W from the resist cover film processing block 13 to the development processing block 12.

The resist cover film removal block 14 includes resist cover film removal processing groups 70a, 70b, and a sixth central robot CR6. The resist cover film removal processing groups 70a, 70b are arranged opposite to each other with the sixth central robot CR6 therebetween. The sixth central robot CR6 has hands CRH9, CRH10 provided one above the other for receiving and transferring the substrates W.

A partition wall 24 is arranged between the resist cover film processing block 13 and the resist cover film removal block 14 for shielding an atmosphere. The partition wall 24 has substrate platforms PASS9, PASS10 provided closely one above the other for receiving and transferring the substrates W between the resist cover film processing block 13 and the resist cover film removal block 14. The upper substrate platform PASS9 is used in transferring the substrates W from the resist cover film processing block 13 to the resist cover film removal block 14, and the lower substrate platform PASS10 is used in transferring the substrates W from the resist cover film removal block 14 to the resist cover film processing block 13.

The cleaning/drying processing block 15 includes thermal processing groups 150, 151 for post-exposure bake, a cleaning/drying processing group 80 and a seventh central robot CR7. The thermal processing group 151 is arranged adjacent to the interface block 16 and has substrate platforms PASS13, PASS14 as described below. The cleaning/drying processing group 80 is arranged opposite to the thermal processing groups 150, 151 for post-exposure bake with the seventh central robot CR7 therebetween. The seventh central robot CR7 has hands CRH11, CRH12 provided one above the other for receiving and transferring the substrates W.

A partition wall 25 is arranged between the resist cover film removal block 14 and the cleaning/drying processing block 15 for shielding an atmosphere. The partition wall 25 has substrate platforms PASS11, PASS12 provided closely one above the other for receiving and transferring the substrates W between the resist cover film removal block 14 and the cleaning/drying processing block 15. The upper substrate platform PASS11 is used in transferring the substrates W from the resist cover film removal block 14 to the cleaning/drying processing block 15, and the lower substrate platform PASS12 is used in transferring the substrates W from the cleaning/drying processing block 15 to the resist cover film removal block 14.

The interface block 16 includes a eighth central robot CR8, a sending buffer unit SBF, an interface transport mechanism IFR, and edge exposure units EEW. Substrate platforms PASS15, PASS16 mentioned below and a return buffer unit RBF are provided under the edge exposure units EEW. The eighth central robot CR8 has hands CRH13, CRH14 provided one above the other for receiving and transferring the substrates W, and the interface transport mechanism IFR has hands H1, H2 provided one above the other for receiving and transferring the substrates W.

FIG. 2 is a side view of the substrate processing apparatus 500 in FIG. 1 that is seen from the +X direction.

The edge-cleaning processing group 90 in the edge-cleaning processing block 9 (see FIG. 1) includes a vertical stack of three edge-cleaning units EC. Details of the edge-cleaning units EC are provided below.

The coating processing group 30 in the anti-reflection film processing block 10 (see FIG. 1) includes a vertical stack of three coating units BARC. Each of the coating units BARC includes a spin chuck 31 for rotating a substrate W while holding the substrate W in a horizontal attitude by suction, and a supply nozzle 32 for supplying coating liquid for anti-reflection film to the substrate W held on the spin chuck 31.

The coating processing group 40 in the resist film processing block 11 (see FIG. 1) includes a vertical stack of three coating units RES. Each of the coating units RES includes a spin chuck 41 for rotating a substrate W while holding the substrate W in a horizontal attitude by suction, and a supply nozzle 42 for supplying coating liquid for resist film to the substrate W held on the spin chuck 41.

The development processing group 50 in the development processing block 12 (see FIG. 1) includes a vertical stack of five development processing units DEV. Each of the development processing units DEV includes a spin chuck 51 for rotating a substrate W while holding the substrate W in a horizontal attitude by suction, and a supply nozzle 52 for supplying development liquid to the substrate W held on the spin chuck 51.

The coating processing group 60 for resist cover film in the resist cover film processing block 13 (see FIG. 1) includes a vertical stack of three coating units COV. Each of the coating units COV includes a spin chuck 61 for rotating a substrate W while holding the substrate W in a horizontal attitude by suction, and a supply nozzle 62 for supplying coating liquid for resist cover film to the substrate W held on the spin chuck 61. Materials having low affinity with resists and water (materials having low reactivity with resists and water) can be used as the coating liquid for resist cover film. For example, fluororesin may be used as the coating liquid. Each of the coating units COV forms the resist cover film on the resist film formed on the substrate W by applying the coating liquid onto the substrate W while rotating the substrate W.

The resist cover film removal processing group 70b in the resist cover film removal block 14 (see FIG. 1) has a vertical stack of three removal units REM. Each of the removal units REM includes a spin chuck 71 for rotating a substrate W while holding the substrate W in a horizontal attitude by suction, and a supply nozzle 72 for supplying stripping liquid (e.g. fluororesin) to the substrate W held on the spin chuck 71. Each removal unit REM removes the resist cover film formed on the substrate W by applying the stripping liquid onto the substrate W while rotating the substrate W.

Note that a method of removing the resist cover films in the removal units REM is not limited to the above examples. For example, the resist cover film may be removed by supplying the stripping liquid onto the substrate W while moving a slit nozzle above the substrate W.

The cleaning/drying processing group 80 in the cleaning/drying processing block 15 (see FIG. 1) has a vertical stack of three cleaning/drying processing units SD. Details of the cleaning/drying processing units SD will be described below.

The interface block 16 includes a vertical stack of the two edge exposure units EEW, the substrate platforms PASS15, PASS16 and the return buffers RBF, as well as the eighth central robot CR8 (see FIG. 1) and the interface transport mechanism IFR. Each of the edge exposure units EEW includes a spin chuck 98 for rotating a substrate W in a horizontal attitude by suction, and a light irradiator 99 for subjecting a peripheral portion of the substrate W held on the spin chuck 98 to exposure.

Figure 3:
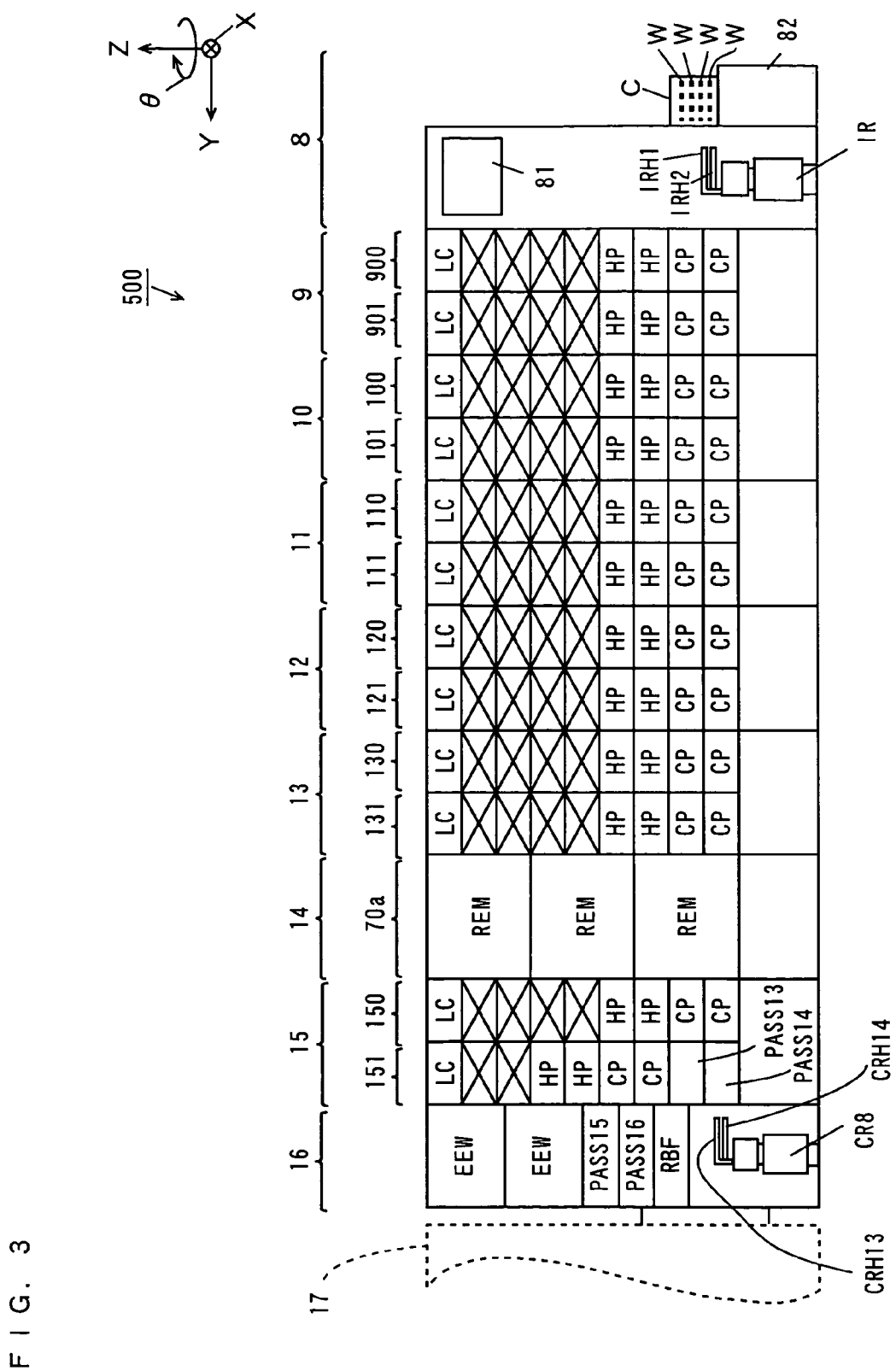
FIG. 3 is a side view of the substrate processing apparatus in FIG. 1 that is seen from the −X direction.

FIG. 3 is a side view of the substrate processing apparatus 500 in FIG. 1 that is seen from the −X direction.

In the edge-cleaning processing block 9, the thermal processing group 900 for post edge-cleaning includes a vertical stack of two heating units (hot plates) HP and two cooling units (cooling plates) CP, and the thermal processing group 901 for post edge-cleaning includes a vertical stack of two heating units HP and two cooling units CP. Each of the thermal processing groups 900, 901 also include a local controller LC on top thereof for controlling the temperatures of the cooling units CP and the heating units HP.

In the anti-reflection film processing block 10, the thermal processing group 100 for anti-reflection film includes a vertical stack of two heating units (hot plates) HP and two cooling units (cooling plates) CP, and the thermal processing group 101 for anti-reflection film includes a vertical stack of two heating units HP and two cooling plates CP. Each of the thermal processing groups 100, 101 also includes a local controller LC on top thereof for controlling the temperatures of the cooling units CP and the heating units HP.

In the resist film processing resist film processing block 11, the thermal processing group 110 for resist film includes a vertical stack of two heating units HP and two cooling units CP, and the thermal processing group 111 for resist film includes a vertical stack of two heating units HP and two cooling units CP. Each of the thermal processing groups 110, 111 also includes a local controller LC on top thereof for controlling the temperatures of the cooling units CP and the heating units HP.

In the development processing block 12, a thermal processing group 120 for development processing includes a vertical stack of two heating units HP and two cooling units CP, and the thermal processing group 121 for development processing includes a vertical stack of two heating units HP and two cooling units CP. Each of the thermal processing groups 120, 121 also includes a local controller LC on top thereof for controlling the temperatures of the cooling units CP and the heating units HP.

In the resist cover film processing block 13, the thermal processing group 130 for resist cover film includes a vertical stack of two heating units HP and two cooling units CP, and the thermal processing group 131 for resist cover film includes a vertical stack of two heating units HP and two cooling units CP. Each of the thermal processing groups 130, 131 includes a local controller LC on top thereof for controlling the temperatures of the cooling units CP and the heating units HP.

In the resist cover film removal block 14, the resist cover film removal processing group 70*a* includes a vertical stack of three removal units REM.

In the cleaning/drying processing block 15, the thermal processing group 150 for post-exposure bake includes a vertical stack of two heating units HP and two cooling units CP, and a thermal processing group 151 for post-exposure bake includes a vertical stack of two heating units HP, two cooling units CP, and substrate platforms PASS13, 14. Each of the thermal processing groups 150, 151 includes a local controller LC on top thereof for controlling the temperatures of the cooling units CP and the heating units HP.

Note that the number of the edge-cleaning units EC, the coating units BARC, RES, COV, the cleaning/drying processing units SD, the removal units REM, the development units DEV, the heating units HP and the cooling units CP may be appropriately changed depending on the processing speed of each block.

(2) Operation of the Substrate Processing Apparatus

Next, the operation of the substrate processing apparatus 500 in the first embodiment will be described with reference to FIGS. 1 to 3.

Carriers C for storing the substrates W in multiple stages are mounted on the carrier platforms 82, respectively, in the indexer block 8. The indexer robot IR takes out a substrate W yet to be processed that is stored in a carrier C using the upper hand IRH1. Then, the indexer robot IR moves in the ±X direction while rotating in the ±θ direction to transfer the unprocessed substrate W onto the substrate platform PASS81.

Although FOUPs (Front Opening Unified Pods) are adopted as the carriers C in this embodiment, SMIF (Standard Mechanical Inter Face) pods or OCs (Open Cassettes) that expose stored substrates W to outside air may also be used, for example. In addition, although linear-type transport robots that move their hands forward or backward by sliding them linearly to a substrate W are used as the indexer robot IR, the first central robot CR1 to the eighth central robot CR8, and the interface transport mechanism IFR, multi-joint type transport robots that linearly move their hands forward and backward by moving their joints may also be used.

The unprocessed substrate W that has been transferred onto the substrate platform PASS81 is received by the first central robot CR1 in the edge-cleaning processing block 9. The first central robot CR1 carries the substrate W into the edge-cleaning processing group 9 with the lower hand CRH92. In each of the edge-cleaning units EC of the edge-cleaning processing group 90, the edge of the unprocessed substrate carried into the substrate processing apparatus 500 is cleaned (edge-cleaning processing).

The first central robot CR1 takes out the substrate W after the edge-cleaning processing from the edge-cleaning processing group 90 with the upper hand CRH91, and carries the substrate W into the thermal processing group 900 or 901.

Then, the first central robot CR1 takes out the thermally processed substrate W from the thermal processing group 900 or 901 with the upper hand CRH91, and transfers the substrate W onto the substrate platform PASS1. Operations of the first central robot CR1 in the edge-cleaning processing block 9 will be described below in detail.

The substrate W on the substrate platform PASS1 is received by the second central robot CR2 in the anti-reflection film processing block 10. The second central robot CR2 carries the substrate W into the coating processing group 30 for anti-reflection film. In the coating processing group 30, the coating unit BARC forms a coating of an anti-reflection film on the substrate W to decrease standing wave and halation.

After this, the second central robot CR2 takes out the substrate W after coating processing from the coating processing group 30, and carries the substrate W into the thermal processing group 100 or 101. Then, the second central robot CR2 takes out the thermally processed substrate W from the thermal processing group 100 or 101, and transfers the substrate W onto the substrate platform PASS3.

The substrate W on the substrate platform PASS3 is received by the third central robot CR3 in the resist film processing block 11. The third central robot CR3 transfers the substrate W onto the coating processing group 40 for resist film. In the coating processing group 40, a coating unit RES forms a coating of a resist film on the substrate W coated with the anti-reflection film.

After this, the third central robot CR3 takes out the substrate W after the coating processing from the coating processing group 40, and carries the substrate W into the thermal processing group 110 or 111. Then, the third central robot CR3 takes out the thermally processed substrate W from the thermal processing group 110 or 111, and transfers the substrate W onto the substrate platform PASS5.

The substrate W on the substrate platform PASS5 is received by the fourth central robot CR4 in the development processing block 12. The fourth central robot CR4 transfers the substrate W onto the substrate platform PASS7.

The substrate W on the substrate platform PASS7 is received by the fifth central robot CR5 in the resist cover film processing block 13. The fifth central robot CR5 carries the substrate W into the coating processing group 60. In the coating processing group 60, a coating unit COV forms a coating of a resist cover film over the resist film as described above.

The fifth central robot CR5 then takes out the substrate W after coating processing from the coating processing group 60, and transfers the substrate W into the thermal processing group 130 or 131 for resist cover film. The fifth central robot CR5 then takes out the substrate W after thermal processing from the thermal processing group 130 or 131, and carries the substrate W onto the substrate platform PASS9.

The substrate W on the substrate platform PASS9 is received by the sixth central robot CR6 in the resist cover film removal block 14. The sixth central robot CR6 transfers the substrate W onto the substrate platform PASS11.

The substrate W on the substrate platform PASS11 is received by the seventh central robot CR7 in the cleaning/drying processing block 15. The seventh central robot CR7 transfers the substrate W onto the substrate platform PASS13.

The substrate W on the substrate platform PASS13 is received by the eighth central robot CR8 in the interface block 16. The eighth central robot CR8 carries the substrate W into an edge exposure unit EEW. In the edge exposure unit EEW, the peripheral portion of the substrate W is subjected to the exposure processing.

The eighth central robot CR8 then takes out the substrate W after the exposure processing from the edge exposure unit EEW, and transfers the substrate W to the substrate platform PASS15. The substrate W on the substrate platform PASS15 is carried into a substrate carrying-in portion 17a in the exposure device 17 (see FIG. 1) by the interface transport mechanism IFR. If the exposure device 17 cannot accept the substrate W, the substrate W is temporarily stored in the sending buffer unit SBF.

The substrate W after the exposure processing in the exposure device 17 is taken out by the interface transport mechanism IFR from a substrate carrying-out portion 17b of the exposure device 17 (see FIG. 1) and carried into the cleaning/drying processing group 80 in the cleaning/drying processing block 15. In a cleaning/drying processing unit SD in the cleaning/drying processing group 80, the substrate W after the exposure processing is subjected to cleaning and drying processing. Details will be described below.

After the substrate W after the exposure processing is subjected to cleaning and drying processing in the cleaning/drying processing group 80, the interface transport IFR takes out the substrate W from the cleaning/drying processing group 80 and carries the substrate W onto the substrate platform PASS16. Details of the operations of the interface transport mechanism IFR in the interface block 16 will be described below.

When cleaning and drying processing can not be applied temporarily in the cleaning/drying processing group 80 due to failure or the like, the substrate W after the exposure processing can be stored temporarily in the return sending buffer unit SBF in the interface block 16.

The substrate W on the substrate platform PASS16 is received by the eighth central robot CR8 in the interface block 16. The eighth central robot CR8 carries the substrate W into the thermal processing group 151 for post-exposure bake in the cleaning/drying processing block 15. In the thermal processing group 151 for post-exposure bake, baking processing after exposure (PEB) is applied to the substrate W. Then, the eighth central robot CR8 takes out the substrate W from the thermal processing group 151 for post-exposure bake and carries the substrate W onto the substrate platform PASS14.

Although baking processing after exposure is applied by the thermal processing group 151 for post-exposure bake, it is also possible to apply baking processing after exposure by the thermal processing group 150 for post-exposure bake.

The substrate W on the substrate platform PASS14 is received by the seventh central robot CR7 in the cleaning/drying processing block 15. The seventh central robot CR7 carries the substrate W onto the substrate platform PASS12.

The substrate W on the substrate platform PASS12 is received by the sixth central robot CR6 in the resist cover film removal block 14. The sixth central robot CR6 carries the substrate W into the resist cover film removal processing group 70a or the resist cover film removal processing group 70b. The resist cover film on the substrate W is removed by a removal unit REM in the resist cover removal processing unit 70a or 70b.

After that, the sixth central robot CR6 takes out the processed substrate W from the resist cover film removal processing group 70a or the resist cover film removal processing group 70b and carries the substrate W onto the substrate platform PASS10.

The substrate W on the substrate platform PASS10 is received by the fifth central robot CR5 in the resist cover film processing block 13. The fifth central robot CR5 carries the substrate W onto the substrate platform PASS8.

The substrate W on the substrate platform PASS8 is received by the fourth central robot CR4 in the development processing block 12. The fourth central robot CR4 carries the substrate W into the development processing group 50. In the development processing group 50, development processing is applied to the substrate W by a development processing unit DEV.

The fourth central robot CR4 then takes out the substrate W after development processing from the development processing group 50 and carries the substrate W into the thermal processing group 120 or 121 for development.

Subsequently, the fourth central robot CR4 takes out the substrate W after thermal processing from the thermal processing groups for development 120, 121 and carries the substrate W into the substrate platform PASS6.

The substrate W on the substrate platform PASS6 is received by the third central robot CR3 in the resist film processing group 11. The third central robot CR3 carries the substrate W onto the substrate platform PASS4.

The substrate W on the substrate platform PASS4 is received by the second central robot CR2 in the anti-reflection film processing block 10. The second central robot CR2 carries the substrate W onto the substrate platform PASS2.

The substrate W on the substrate platform PASS2 is received by the first central robot CR1 in the edge-cleaning processing block 9. The first central robot CR1 carries the substrate W onto the substrate platform PASS82.

The substrate W on the substrate platform PASS82 is stored in a carrier C by the indexer robot IR in the indexer block 8.

(3) Edge-Cleaning Unit

Now, the aforementioned edge-cleaning unit EC will be described in detail with reference to drawings. Note that the operations of the components of the edge-cleaning unit EC described below are controlled by a main controller (controller) 81.

(3-a) One Example of Configuration of Cleaning/Drying Processing Unit

Figure 4:
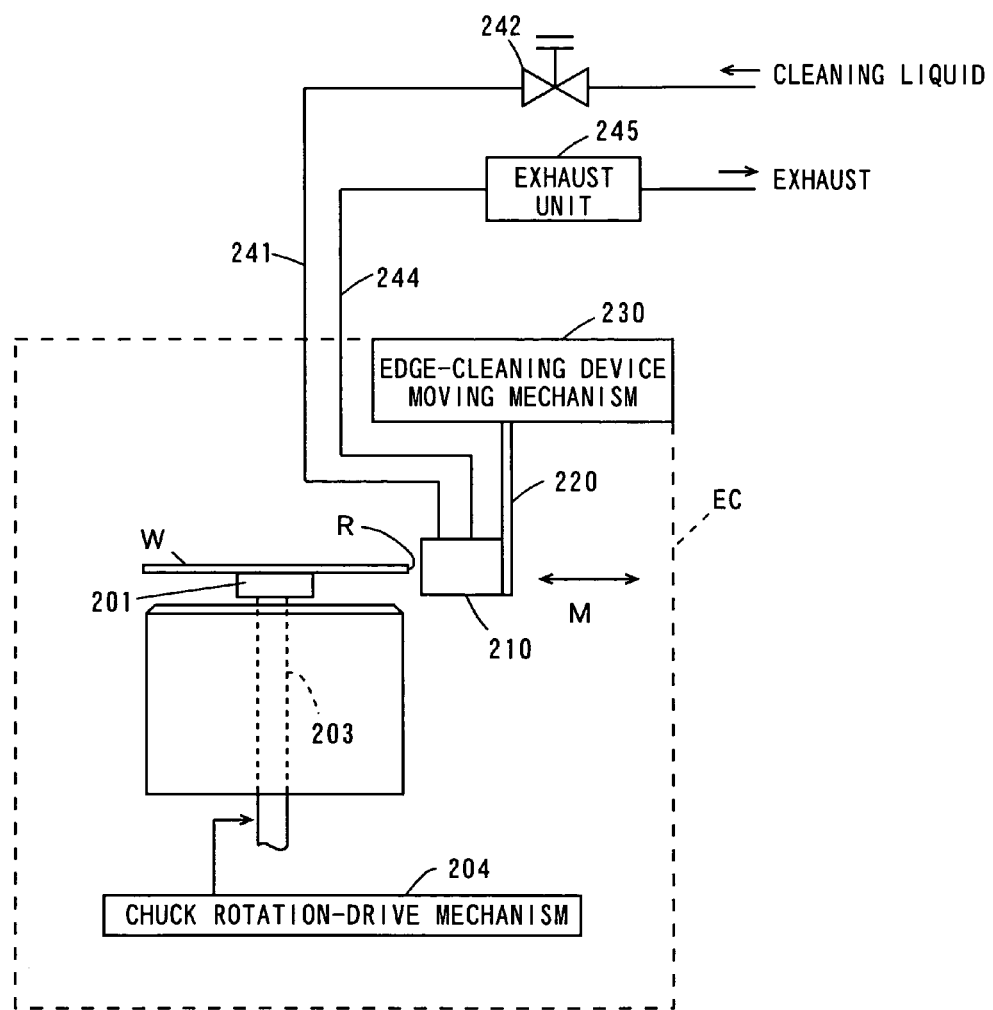
FIG. 4 is a diagram for use in illustrating the configuration of the edge-cleaning unit.

FIG. 4 is a diagram for use in illustrating the configuration of the edge-cleaning unit EC. As shown in FIG. 4, the edge-cleaning unit EC includes a spin chuck 201 for rotating the substrate W about the vertical rotation axis passing through the center of the substrate W while horizontally holding the substrate W.

The spin chuck 201 is secured to an upper end of a rotation shaft 203, which is rotated via a chuck rotation-drive mechanism 204. An air suction passage (not shown) is formed in the spin chuck 201. With the substrate W being mounted on the spin chuck 201, air inside the air suction passage is discharged, so that a back surface of the substrate W is sucked onto the spin chuck 201 by vacuum, and the substrate W can be held in a horizontal attitude.

On the side of the spin chuck 201 and in an upper part inside the edge-cleaning unit EC, an edge-cleaning device moving mechanism 230 is provided. The edge-cleaning device moving mechanism 230 is provided with a bar shaped supporting member 220 that extends downward. The supporting member is moved horizontally by the edge-cleaning device moving mechanism 230 (see an arrow M in FIG. 4).

An approximately cylindrical edge-cleaning device 210 is secured to the lower end of the supporting member 220 so as to extend horizontally. Thus, the edge-cleaning device 210 is moved together with the supporting member 220 by the edge-cleaning device moving mechanism 230.

The edge-cleaning device 210 is positioned on approximately the same level as the substrate W sucked and held by the spin chuck 201. Thus, one end of the edge-cleaning device 210 is opposite to the edge R of the substrate W. In the below description, the end of the edge-cleaning device 210 that is opposite to the edge R of the substrate W is regarded as a front side.

Now, the definition of the aforementioned edge R of the substrate W is described with reference to a drawing.

Figure 5:
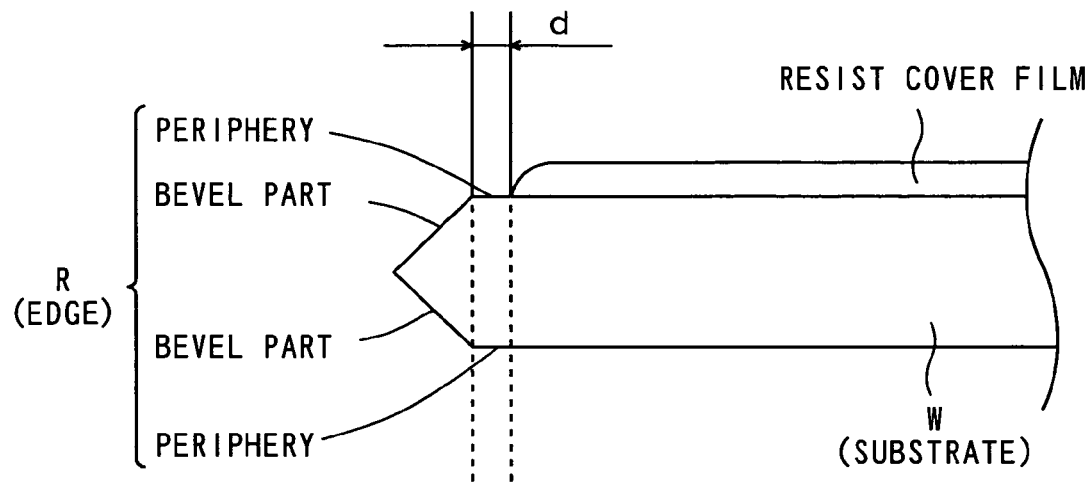
FIG. 5 is a schematic diagram for use in illustrating the edge of the substrate.

FIG. 5 is a schematic diagram for use in illustrating the edge R of the substrate W. As shown in FIG. 5, the anti-reflection film, the resist film (both not shown) and the resist cover film mentioned above are formed on the substrate W.

The substrate W has an end face that is illustrated schematically in FIG. 5. This end face is typically called a bevel part. Also, a ring region along the peripheral end, which has a width d (FIG. 5), on the face of the substrate W on which the resist cover is formed is generally referred to as a periphery. According to the embodiment, the portion including the bevel part and the periphery mentioned above is referred to as the edge R. The above-described distance d is, for example, 2 to 3 mm.

Returning to FIG. 4, at the start of the edge-cleaning processing to the substrate W, the edge-cleaning device 210 is moved to the position of the edge of the substrate W by the edge-cleaning device moving mechanism 230. Also, at the end of the edge-cleaning processing to the substrate W, the edge-cleaning device 210 is moved away from the edge R of the substrate W by the edge-cleaning device moving mechanism 230.

The edge-cleaning device 210 has a space inside (an aftermentioned cleaning room 211). A cleaning liquid supply pipe 241 and an exhaust pipe 244 are connected to the edge-cleaning device 210. The cleaning liquid supply pipe 241 is connected to a cleaning liquid supply system that is not shown through the valve 242. A cleaning liquid is supplied to the inner space of the edge-cleaning device 210 through the cleaning liquid supply pipe 241 by opening the valve 242.

Moreover, the exhaust pipe 244 is connected to an exhaust unit 245. The exhaust unit 245 sucks and exhausts the atmosphere in the inner space of the edge-cleaning device 210 through the exhaust pipe 244.

Figure 6:
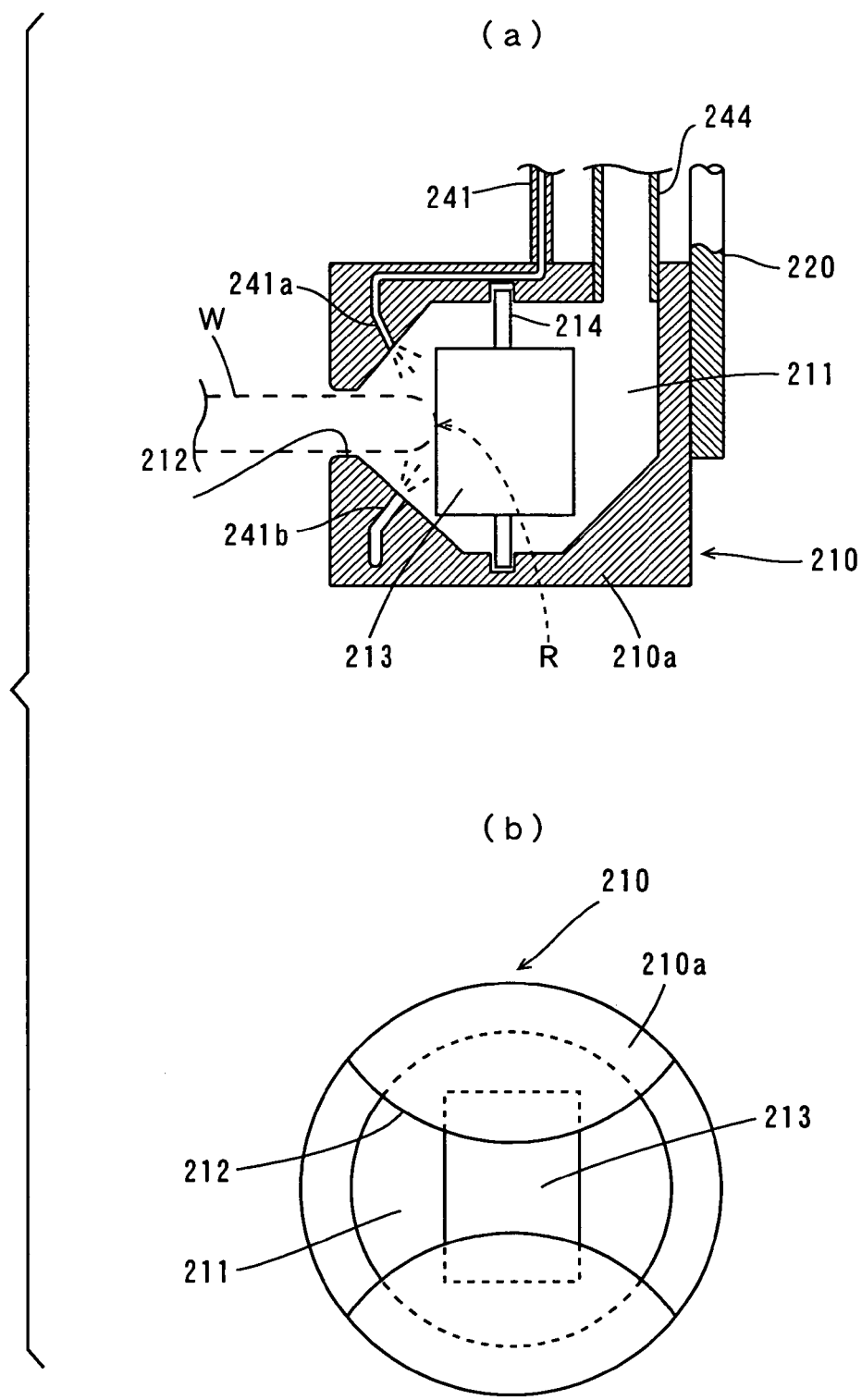
FIG. 6 is a diagram for use in illustrating the configuration of the edge-cleaning device of the edge-cleaning unit in FIG. 4.

The edge-cleaning device 210 is described in detail. FIG. 6 is a diagram for use in illustrating the configuration of the edge-cleaning device 210 in the edge-cleaning unit EC in FIG. 4. FIG. 6(a) is a vertical cross-sectional view of the edge-cleaning device 210, and FIG. 6(b) is a front view of the edge-cleaning device 210.

As shown in FIG. 6(a), the cleaning room 211 is formed inside an approximately cylindrical housing 210a in the edge-cleaning device 210.

In addition, as shown in FIG. 6 (a) and FIG. 6 (b), an opening 212 is formed in a front side of the housing 210a so that the cleaning room 211 is communicated with the outside. The opening 212 has an arch-shaped top face and bottom face so that the distance between the top and bottom faces is gradually increased from the center to both sides. During the edge-cleaning processing to the substrate W, the edge R of the substrate W sucked and held by the spin chuck 201 is inserted into the opening 212.

In the cleaning room 211, an approximately cylindrical brush 213 is arranged so as to extend in the vertical direction. The brush 213 is secured to a rotation shaft 214 that extends in the vertical direction. An upper end of the rotation shaft 214 and a lower end thereof are rotatably attached to rotation bearings formed on an upper part of a cleaning room 31 and a lower part thereof. The brush 213 is thus rotatably supported by the rotation shaft 214 in the cleaning room 211.

During the edge-cleaning processing to the substrate W, the edge R of the substrate W rotating is brought into contact with the brush 213. This causes the edge R of the substrate W to be cleaned by the brush 213.

In the edge-cleaning unit EC shown in FIG. 4, the rotation shaft 214 provided with the brush 213 is arranged in approximately parallel to a rotation shaft 203 to which the spin chuck is secured. This causes the brush 213 to be rotated while being firmly in contact with the edge R of the substrate W rotating. Contaminants adhering to the edge R of the substrate W are thus stripped off.

The aforementioned cleaning liquid supply pipe 241 and the exhaust pipe 244 are connected to the upper part of the edge-cleaning device 210.

The cleaning liquid supply pipe 241 is connected to cleaning liquid supply paths 241a and 241b formed in the housing 210a. As shown in FIG. 6 (a), the cleaning liquid supply path 241a extends from the outside of the housing 210a to the upper and inner side of the cleaning room 211. Also, the cleaning liquid supply path 241b extends from the outside of the housing 210a to the lower and inner side of the cleaning room 211. Only a part of the cleaning liquid supply path 241b is shown in FIG. 6 (a).

During the edge-cleaning processing to the substrate W, the cleaning liquid supplied to the edge-cleaning device 210 is thus sprayed from above and below to the edge R of the substrate W being contact with the brush 213 in the cleaning room 211, thereby cleaning the edge R of the substrate W effectively.

The exhaust pipe 244 is inserted into the cleaning room 211 through a hole provided on the upper part of the housing 210a. As mentioned above, this causes the atmosphere in the cleaning room 211 to be sucked and exhausted through the exhaust pipe 244 by the exhaust unit 245.

Since the atmosphere in the cleaning room 211 is discharged by the exhaust unit 245 in this way, the vaporized cleaning liquid and the mist of the cleaning liquid are effectively discharged.

In the above, any of a predetermined resist solvent, a fluorine-based chemical solution, an ammonia hydrogen peroxide mixture, and liquids used in the liquid immersion method is used as a liquid to be supplied to the edge-cleaning device 210 and sprayed to the edge R of the substrate W.

In addition, as a cleaning liquid, for example, any of pure water, a pure water solution containing a complex (ionized), carbonated water, hydrogen water, electrolytic ionic water, HFE (hydrofluoroether), fluorinated acid, sulfuric acid and sulfuric acid/hydrogen peroxide mixture may be used.

(3-b) Another Example of the Configuration of the Edge-Cleaning Unit

Figure 7:
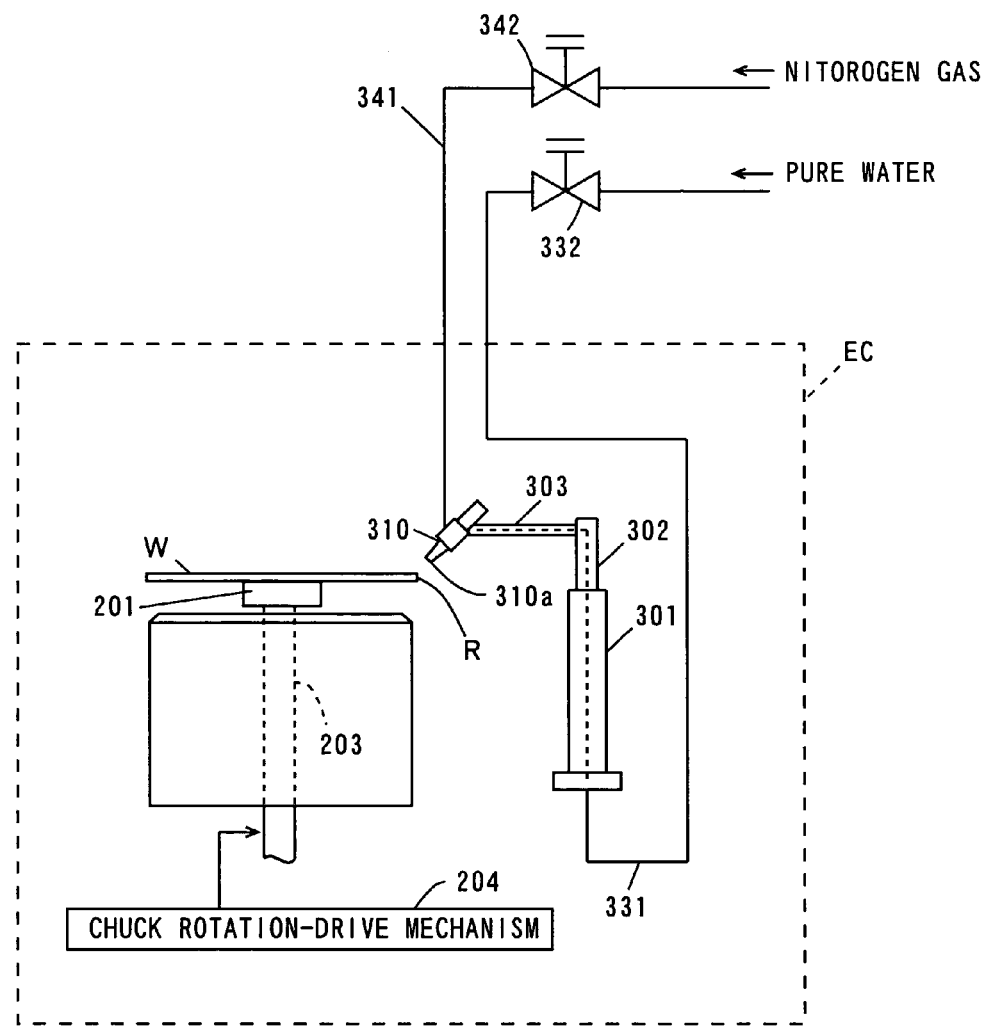
FIG. 7 is a diagram for use in illustrating another configuration example of the edge-cleaning unit used in the first embodiment.

The edge-cleaning unit EC may have the following configuration. FIG. 7 is a diagram for use in illustrating another example of the configuration of the edge-cleaning unit EC used in the first embodiment. The edge-cleaning unit EC in FIG. 7 is different from the edge-cleaning unit EC in FIG. 4 as described below.

As shown in FIG. 7, a motor 301 is provided lateral to a spin chuck 201. A rotation shaft 302 is connected to the motor 301. Also, an arm 303 is connected to the rotation shaft 302 so as to extend in the horizontal direction and a two-fluid nozzle 310 is provided to an end of the arm 303. This two-fluid nozzle 310 discharges a fluid mixture of a gas and a liquid. Details are described below.

The two-fluid nozzle 310 is attached to the end of the arm 303, inclined to the main surface of the substrate W held by the spin chuck 201.

At the start of the edge-cleaning processing to the substrate W, the arm 303 is swung while the rotation shaft 302 is rotated by the motor 301. This causes the two-fluid nozzle 310 to move obliquely above the edge R of the substrate W held by the spin chuck 621. As a result, a discharge portion 310a of the fluid mixture of the two-fluid nozzle 310 is positioned opposite to the edge R of the substrate W.

A cleaning liquid supply pipe 331 is provided so as to pass through the rotation shaft 302 and the arm 303. One end of the cleaning liquid supply pipe 331 is connected to the two-fluid nozzle 310 and the other end is connected through a valve 332 to a cleaning liquid supply system that is not shown. By opening the valve 332, a cleaning liquid is supplied through the cleaning liquid supply pipe 331 to the two-fluid nozzle 310. Note that although pure water is used as a cleaning liquid, for example, any of a predetermined resist solvent, a fluorine-based chemical solution, an ammonia hydrogen peroxide-water mixture, liquids used in the liquid immersion method, fluorinated acid, sulfuric acid and sulfuric acid/hydrogen peroxide mixture may be used instead of pure water in this example.

In addition, an end of a gas supply pipe 341 is connected to the two-fluid nozzle 310 similarly to the cleaning liquid supply pipe 331. The other end of the gas supply pipe 341 is connected through a valve 342 to a cleaning liquid supply system. By opening the valve 342, a gas is supplied to the two-fluid nozzle 310. Note that although nitrogen gas is used as a gas supplied to the two-fluid nozzle 310, other inert gases such as argon gas and helium gas may be used instead of nitrogen gas in this example.

During the edge-cleaning processing to the substrate W, a cleaning liquid and a gas are supplied to the two-fluid nozzle 310. This causes the two-fluid nozzle to discharge the fluid mixture to the edge R of the substrate W rotating. The edge R of the substrate W is thus cleaned.

Figure 8:
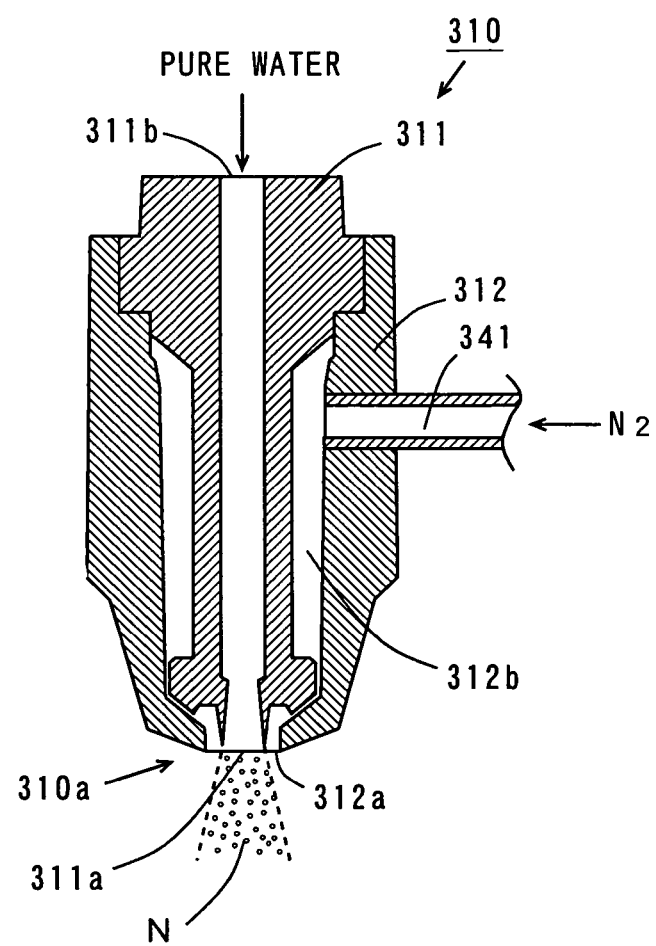
FIG. 8 is a longitudinal cross-sectional view showing an example of the internal structure of the two-fluid nozzle used for edge-cleaning processing.

One example of the configuration in the two-fluid nozzle 310 is described. FIG. 8 is a longitudinal cross-sectional view showing one example of the internal structure of the two-fluid nozzle 310 used for the edge-cleaning processing.

The two-fluid nozzle 310 shown in FIG. 8 is so-called an external mixture type. The external mixture type two-fluid nozzle 310 shown in FIG. 8 comprises an inner body portion 311 and an outer body portion 312. The inner body portion 311 is made of quartz or the like, for example, and the outer body portion 312 is made of fluororesin such as PTFE (polytetrafluoroethylene), for example.

A pure water introduction port 311b is formed along the central axis of the inner body portion 311. The cleaning liquid supply pipe 331 in FIG. 7 is secured to the pure water introduction port 311b. The pure water supplied from the cleaning liquid supply pipe 331 is thus introduced into the pure water introduction port 311b.

A pure water discharge port 311a communicated with the pure water introduction port 311b is formed at a lower end of the inner body portion 311. The inner body portion 311 is inserted into the outer body portion 312. The upper ends of the inner body portion 311 and the outer body portion 312 are joined to each other while the lower ends thereof are not joined.

A cylindrical gas passage 312b is formed between the inner body portion 311 and the outer body portion 312. A gas discharge port 312a communicated with the gas passage 312b is formed at the lower end of the outer body portion 312. The gas supply pipe 341 shown in FIG. 7 is mounted to the peripheral wall of the outer body portion 312 so as to be communicated with the gas passage 312b. A nitrogen gas ($N_2$) supplied from the gas supply pipe 341 is thus introduced into the gas passage 312b.

The diameter of the gas passage 312b gradually decreases downward in the vicinity of the gas discharge port 312a. As a result, the gas flow rate of the nitrogen gas ($N_2$) is accelerated and the nitrogen gas is discharged from the gas discharge port 312a.

The pure water discharged from the pure water discharge port 311a and the nitrogen gas ($N_2$) discharged from the gas discharge port 312a are mixed outside in the vicinity of the lower end of the two-fluid nozzle 310, and a misty fluid mixture N including fine droplets of the pure water is generated.

As mentioned above, during the edge-cleaning processing to the substrate W, the misty fluid mixture N is discharged to the edge R of the substrate W, thereby cleaning the main surface of the edge R of the substrate W.

Note that an internal mixture type two-fluid nozzle 310 for generating the fluid mixture N in the nozzle body may be used instead of the two-fluid nozzle 310 in FIG. 8, in the edge-cleaning unit EC in FIG. 7. Another example of the internal structure of the two-fluid nozzle 310 is described.

Figure 9:
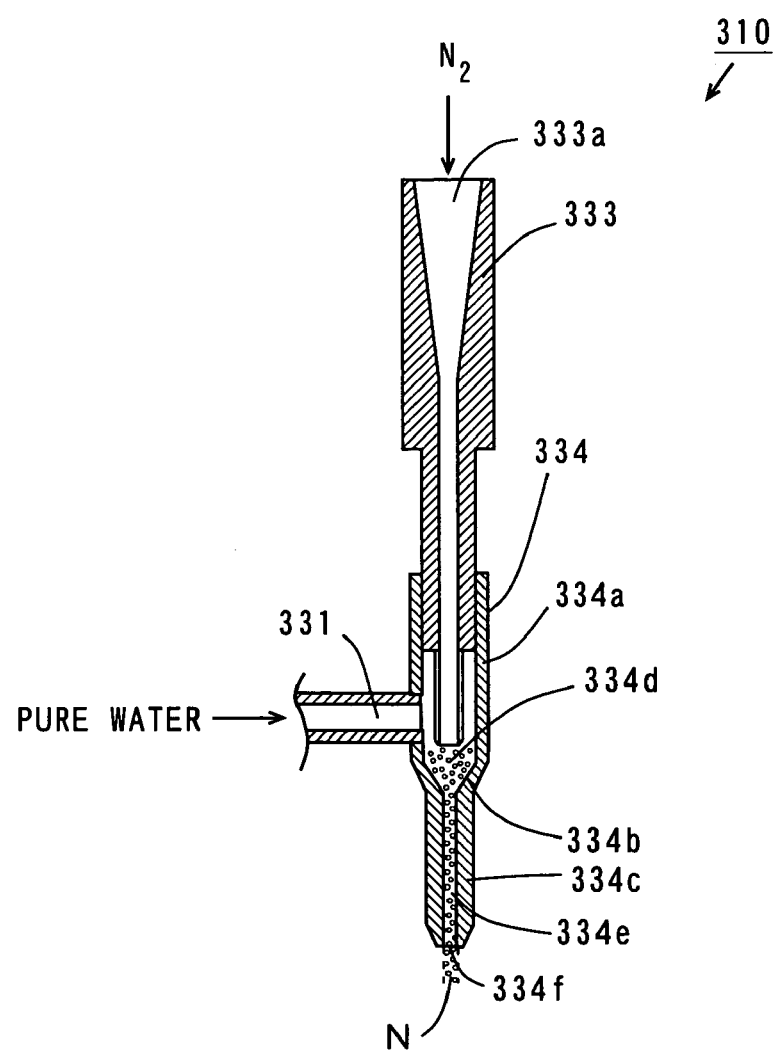
FIG. 9 is a longitudinal cross-sectional view showing another example of the internal structure of the two-fluid nozzle used for edge-cleaning processing.

FIG. 9 is a longitudinal cross-sectional view showing another example of the internal structure of the two-fluid nozzle 310 used for the edge-cleaning processing. The two-fluid nozzle 310 shown in FIG. 9 is so-called an internal mixture type.

The internal mixture type two-fluid nozzle 310 shown in FIG. 9 comprises a gas introduction pipe 333 and a main body 334. The main body 334 is made of quartz, for example, and the gas introduction pipe 333 is made of PTFE, for example.

A gas introduction port 333a is formed in the gas introduction pipe 333 so as to be communicated from the upper end of the gas introduction pipe 333 to the lower end thereof. Also, the gas supply pipe 341 in FIG. 7 is secured to the upper end of the gas introduction pipe 333. The nitrogen gas supplied from the gas supply pipe 341 is thus introduced into the gas introduction port 333a.

The main body 334 comprises an upper tube 334a having a large diameter, a taper portion 334b and a lower tube 334c having a small diameter.

A mixture room 334d is formed in the taper portion 334b of the upper tube 334a and a direct flow passage 334e is formed in the lower tube 334c. A fluid mixture discharge port 334f communicated with the direct flow passage 334e is formed at the lower end of the lower tube 334c.

The cleaning liquid supply pipe 331 in FIG. 7 is secured to the upper tube 334a of the main body 334 so as to be communicated with the mixture room 334d. The pure water supplied from the cleaning liquid supply pipe 331 is thus introduced into the mixture room 334d. The lower end of the gas introduction pipe 333 is inserted into the mixture room 334d in the upper tube of the main body 334.

In the internal mixture type two-fluid nozzle 310, a compressed nitrogen gas ($N_2$) is supplied from the gas introduction port 333a and the pure water is supplied from the cleaning liquid supply pipe 331, the nitrogen gas ($N_2$) and the pure water are mixed in the mixture room 334d and the misty fluid mixture N including fine droplets of the pure water is generated.

The flow rate of the fluid mixture N generated in the mixture room 334d is accelerated when passing through the taper portion 334b and the direct flow passage 334e. The accelerated fluid mixture N is discharged from the fluid mixture discharge port 334f to the edge R of the substrate W, thereby cleaning the edge R of the substrate W.

(3-c) Further Example of the Configuration of the Edge-Cleaning Unit

Figure 10:
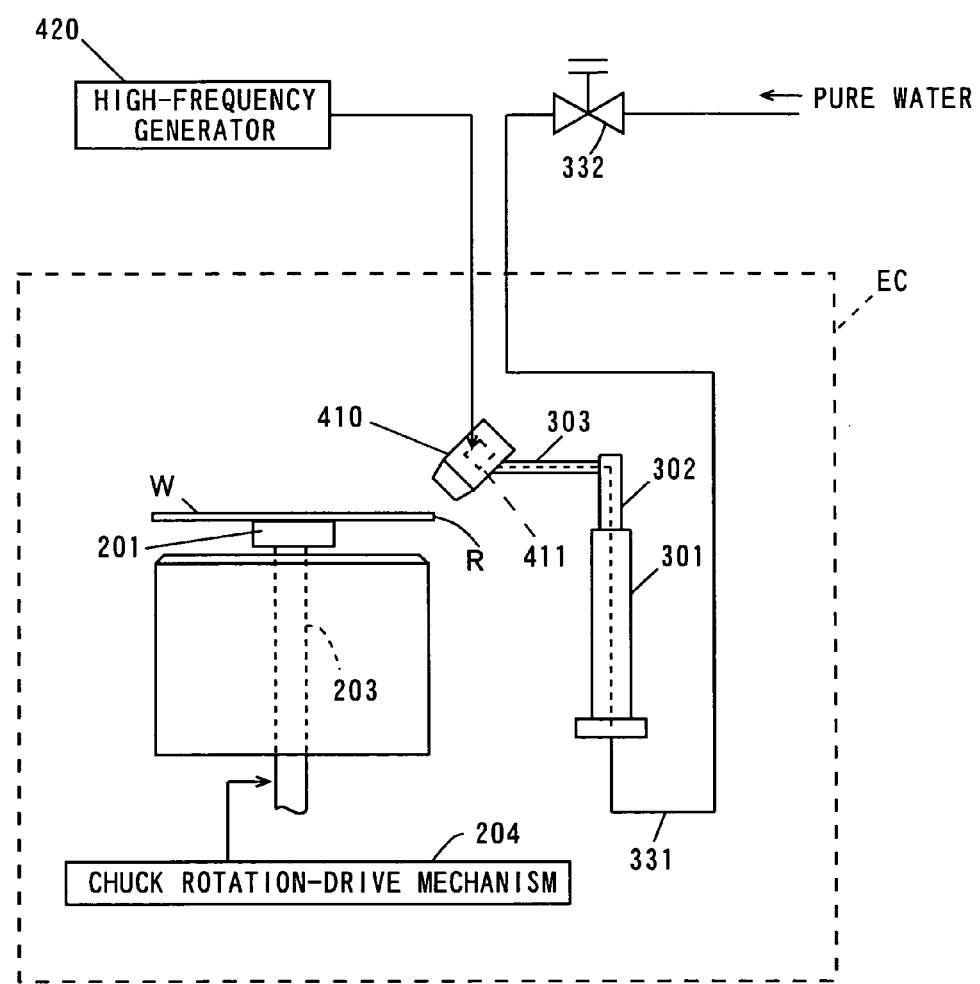
FIG. 10 is a diagram for use in illustrating a further configuration example of the edge-cleaning unit used in the first embodiment.

The edge-cleaning unit EC may further include the following configuration. FIG. 10 is a diagram for use in illustrating a further example of the configuration of the edge-cleaning unit EC used in the first embodiment. The edge-cleaning unit EC in FIG. 10 is different from the edge-cleaning unit EC in FIG. 7 as described below.

As shown in FIG. 10, in the edge-cleaning unit EC of this example, an ultrasonic nozzle 410 is provided at an end of an arm 303 instead of the two-fluid nozzle 310.

Note that the ultrasonic nozzle 410 is secured to the end of the arm 303 so as to be inclined against the main surface of the substrate W held by the spin chuck 201 also in this example.

The cleaning liquid supply pipe 331 is connected to the ultrasonic nozzle 410. The cleaning liquid is thus supplied through the cleaning liquid supply pipe 331 to the ultrasonic nozzle 410 by opening the valve 332 similarly to the example in FIG. 7. Note that pure water is used as a cleaning liquid also in this example.

A high-frequency oscillator 411 is incorporated in the ultrasonic nozzle 410. The high-frequency oscillator 411 has electrical interconnections with a high-frequency generator 420.

During the edge-cleaning processing to the substrate W, the pure water is discharged from the ultrasonic nozzle 410 toward the edge R of the substrate W. When the pure water is discharged from the ultrasonic nozzle 410, a high-frequency current is supplied from the high-frequency generator 420 to the high-frequency oscillator 411.

Thus, the high-frequency oscillator 411 produces ultrasonic vibration, which applies high-frequency power to the pure water passing through the ultrasonic nozzle 410 corresponding to the value of the high-frequency current. As a result, the pure water in an ultrasonic vibration state is discharged to the edge R of the substrate W, thereby cleaning the edge R of the substrate W.

(4) The First Central Robot

Figure 11:
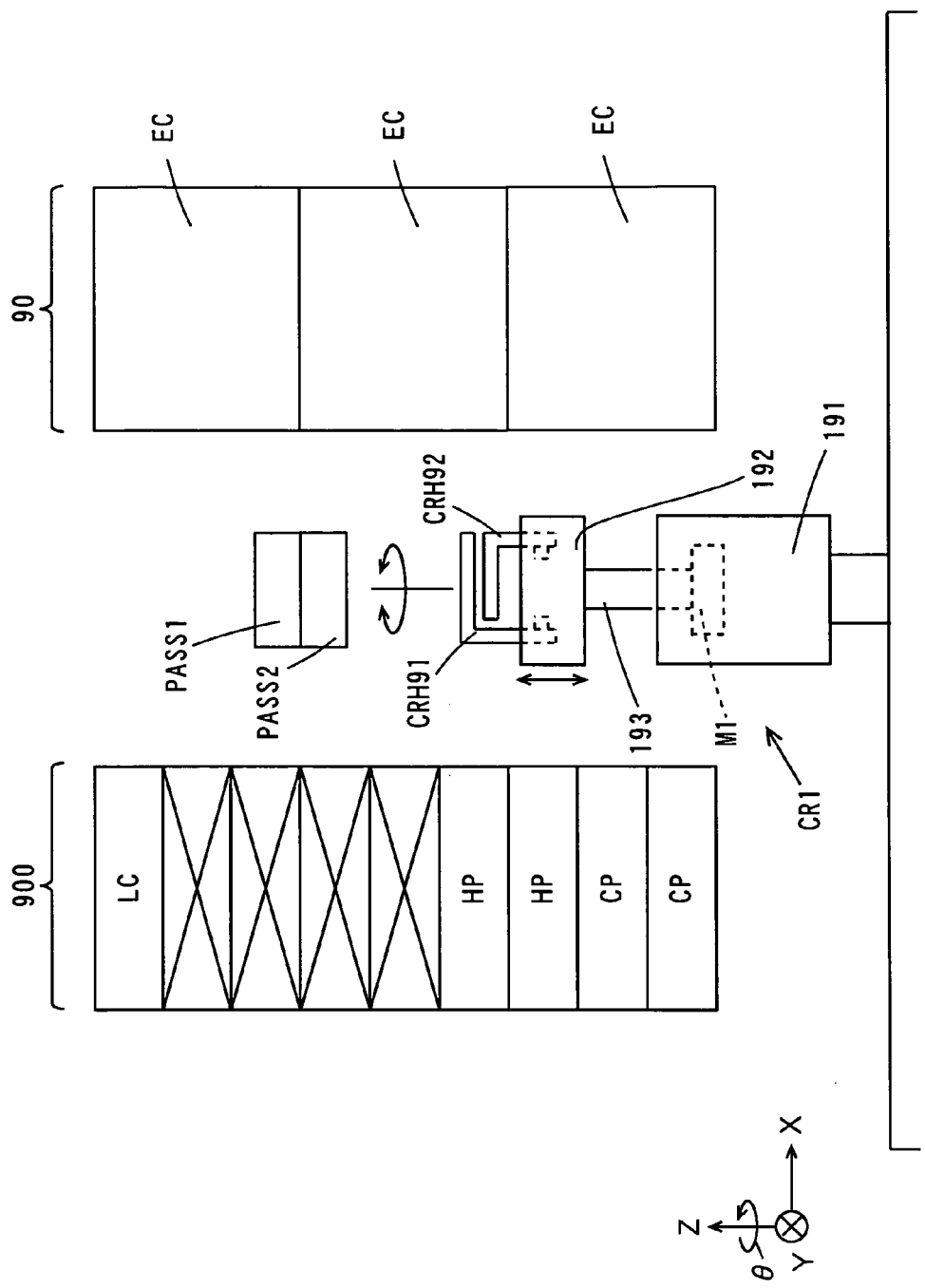
FIG. 11 is a diagram of the edge-cleaning processing block in FIG. 1 that is seen from the −Y direction.

The operations of the first central robot CR1 in the edge-cleaning processing block 9 provided with the aforementioned edge-cleaning unit EC are described. FIG. 11 is a diagram of the edge-cleaning processing block in FIG. 1 that is seen from the −Y direction.

As shown in FIG. 11, a hand support base 192 is mounted on a fixed base 191 so as to be rotatable in the ±θ direction and movable up and down in the ±Z direction. The hand support base 192 is coupled to a motor M1 inside the fixed base 191 through a rotation shaft 193 and rotated by the motor M1. Two hands CRH91, CRH92 for holding the substrate W in a horizontal attitude are provided to the hand support base 192 one above the other, so as to be movable forward and backward.

The substrate W on the substrate platform PASS81 (see FIG. 1) is received by the lower hand CRH92 of the first central robot CR1. Then, the first central robot CR1 rotates and moves up and down the hand support base 192 in the ±Z direction, to carry the substrate W into the edge-cleaning unit EC of the edge-cleaning processing group 90 by using the hand CRH92. This causes the edge-cleaning unit EC applies the edge-cleaning processing to the unprocessed substrate W.

Next, the first central robot CR1 receives the edge-cleaning-processed substrate W from the edge-cleaning unit EC of the edge-cleaning processing group 90 by using the upper hand CRH91.

Subsequently, the first central robot CR1 rotates and moves up and down the hand support base 192 in the ±Z direction, to carry the substrate W into a heating unit HP of the thermal processing group 900 for post edge-cleaning by using the hand CRH91. Thus, the heating unit HP applies the thermal processing to the substrate W, thereby removing a cleaning liquid that adheres to the substrate W in the edge-cleaning and drying the substrate W.

After that, the first central robot CR1 receives the thermally-processed substrate W from the heating unit HP of the thermal processing group 900 for post edge-cleaning by using the upper hand CRH91.

The first central robot CR1 carries the substrate W received from the heating unit HP into a cooling unit CP of the thermal processing group 900 for post edge-cleaning. Thus, the cooling unit CP applies the cooling processing to the substrate W.

The first central robot CR1 then receives the cooling-processed substrate W from the cooling unit CP of the thermal processing group 900 for post edge-cleaning by using the upper hand CRH91. The first central robot CR1 transfers the substrate W onto the upper substrate platform PASS1.

(5) Cleaning/Drying Processing Unit

Now, the aforementioned cleaning/drying processing unit SD will be described in detail with reference to drawings.

(5-a) Configuration of Cleaning/Drying Processing Unit

Figure 12:
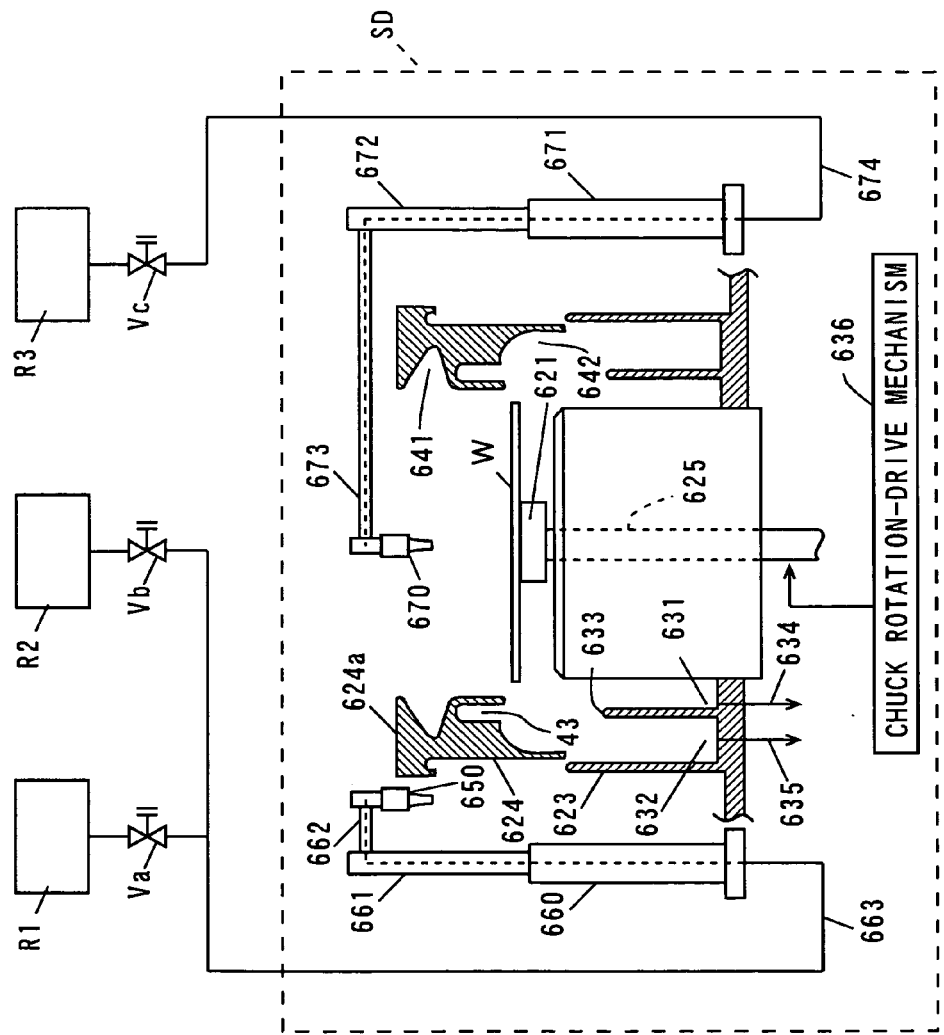
FIG. 12 is a diagram for use in illustrating the configuration of the cleaning/drying processing unit.

The configuration of a cleaning/drying processing unit SD is described. FIG. 12 is a diagram for use in illustrating the configuration of the cleaning/drying processing unit SD.

As shown in FIG. 12, the cleaning/drying unit SD includes a spin chuck 621 for rotating a substrate W about the vertical rotation shaft passing through the center of the substrate W while horizontally holding the substrate W.

The spin chuck 621 is secured to an upper end of a rotation shaft 625, which is rotated via a chuck rotation-drive mechanism 636. An air suction passage (not shown) is formed in the spin chuck 621. With the substrate W being mounted on the spin chuck 621, air inside the air suction passage is discharged, so that a back surface of the substrate W is sucked onto the spin chuck 621 by vacuum, and the substrate W can be held in a horizontal attitude.

A first rotation motor 660 is arranged outside the spin chuck 621. The first rotation motor 660 is connected to a first rotation shaft 661. The first rotation shaft 661 is coupled to a first arm 662, which extends in the horizontal direction, and whose end is provided with a nozzle 650 for cleaning processing.

The first rotation shaft 661 is rotated by the first rotation motor 660, so that the first arm 662 swings. This causes the nozzle 650 to move above the substrate W held on the spin chuck 621.

A supply pipe 663 for cleaning processing is arranged so as to pass through the inside of the first rotation motor 660, the first rotation shaft 661, and the first arm 662. The supply pipe 663 is connected to a cleaning liquid supply source R1 and a rinse liquid supply source R2 through a valve Va and a valve Vb, respectively. By controlling the opening and closing of the valves Va, Vb, it is possible to select a processing liquid supplied to the supply pipe 663 and adjust the amount of the processing liquid. In the configuration of FIG. 12, when the valve Va is opened, a cleaning liquid is supplied to the supply pipe 663, and when the valve Vb is opened, a rinse liquid is supplied to the supply pipe 663.

The cleaning liquid or the rinse liquid is supplied to the nozzle 650 through the supply pipe 663 from the cleaning liquid supply source R1 or the rinse liquid supply source R2. The cleaning liquid or the rinse liquid is thus supplied to a main surface of the substrate W. Examples of the cleaning liquid may include pure water, a pure water solution containing a complex (ionized), or a fluorine-based chemical solution. Examples of the rinse liquid may include pure water, carbonated water, hydrogen water, electrolytic ionic water, and HFE (hydrofluoroether).

A second rotation motor 671 is arranged outside the spin chuck 621. The second rotation motor 671 is connected to a second rotation shaft 672. The second rotation shaft 672 is coupled to a second arm 673, that extends in the horizontal direction, and whose end is provided with a nozzle 670 for drying processing.

The second rotation shaft 672 is rotated by the second rotation motor 671, so that the second arm 673 swings. This causes the nozzle 670 to move above the substrate W held on the spin chuck 621.

A supply pipe 674 for drying processing is arranged so as to pass through the inside of the second rotation motor 671, the second rotation shaft 672, and the second arm 673. The supply pipe 674 is connected to an inert gas supply source R3 through a valve Vc. By controlling the opening and closing of the valve Vc, it is possible to adjust the amount of the inert gas supplied to the supply pipe 674.

The inert gas is supplied to the nozzle 670 through the supply pipe 674 from the inert gas supply source R3. The inert gas is thus supplied to the main surface of the substrate W. Nitrogen gas ($N_2$), for example, may be used as the inert gas.

When supplying the cleaning liquid or the rinse liquid onto the main surface of the substrate W, the nozzle 650 is positioned above the substrate. When supplying the inert gas onto the main surface of the substrate W, the nozzle 650 is retracted to a predetermined position.

When supplying the cleaning liquid or the rinse liquid onto the main surface of the substrate W, the nozzle 670 is retracted to a predetermined position. When supplying the inert gas onto the main surface of the substrate W, the nozzle 670 is positioned above the substrate W.

The substrate W held on the spin chuck 621 is housed in a processing cup 623. A cylindrical partition wall 633 is provided inside the processing cup 623. A discharge space 631 is formed so as to surround the spin chuck 621 for discharging the processing liquid (i.e., cleaning liquid or rinse liquid) used in processing the substrate W. Also, a liquid recovery space 632 is formed between the processing cup 623 and the partition wall 633, so as to surround the discharge space 631, for recovering the processing liquid used in processing the substrate W.

The discharge space 631 is connected with a discharge pipe 634 for directing the processing liquid to a liquid discharge processing device (not shown), while the liquid recovery space 632 is connected with a recovery pipe 635 for directing the processing liquid to a recovery processing device (not shown).

A guard 624 is provided above the processing cup 623 for preventing the processing liquid on the substrate W from splashing outward. The guard 624 is configured to be rotation-symmetric with respect to the rotation shaft 625. An annular-shaped liquid discharge guide groove 641 with a V-shaped cross section is formed inwardly of an upper end portion of the guard 624.

Also, a liquid recovery guide 642 having an inclined main surface that inclines down outwardly is formed inwardly of a lower portion of the guard 624. A partition wall housing groove 643 for receiving the partition wall 633 in the processing cup 623 is formed in the vicinity of the upper end of the liquid recovery guide 642.

This guard 624 is provided with a guard lifting mechanism (not shown) composed of a ball-screw mechanism or the like. The guard lifting mechanism lifts and lowers the guard 624 between a recovery position in which the liquid recovery guide 642 is positioned opposite to outer edges of the substrate W held on the spin chuck 621 and a discharge position in which the liquid discharge guide groove 641 is positioned opposite to the outer edges of the substrate W held on the spin chuck 621. When the guard 624 is in the recovery position (i.e., the position of the guard shown in FIG. 12), the processing liquid splashed out from the substrate W is directed by the liquid recovery guide 642 to the liquid recovery space 632, and then recovered through the recovery pipe 635. On the other hand, when the guard 624 is in the discharge position, the processing liquid splashed out from the substrate W is directed by the liquid discharge guide groove 641 to the discharge space 631, and then discharged through the discharge pipe 634. With such a configuration, discharge and recovery of the processing liquid is performed.

(5-b) Operation of the Cleaning/Drying Processing Unit

The processing operation of the cleaning/drying processing unit SD having the aforementioned configuration is next described. Note that the operation of each component in the cleaning/drying processing unit SD described below is controlled by the main controller (controller) 81 in FIG. 1.

When the substrate W is initially carried into the cleaning/drying processing unit SD, the guard 624 is lowered, and the interface transport mechanism IFR in FIG. 1 places the substrate W onto the spin chuck 621. The substrate W on the spin chuck 621 is held by suction.

Next, the guard 624 moves to the aforementioned discharge position, and the nozzle 650 moves above the center of the substrate W. Then, the rotation shaft 625 rotates, causing the substrate W held on the spin chuck 621 to rotate. After this, the cleaning liquid is discharged onto the main surface of the substrate W from the nozzle 650. The substrate W is thus cleaned.

In the cleaning/drying processing unit 80a, the part of the component of the resist cover film on the substrate W is eluted in the cleaning liquid. During the cleaning of the substrate W, the substrate W is rotated since the cleaning liquid is supplied onto the substrate W. This causes the cleaning liquid on the substrate W to constantly move toward a peripheral portion of the substrate W by the centrifugal force, and splash away. It is therefore possible to prevent the component of the resist cover film eluted in the cleaning liquid from remaining on the substrate W. Note that the aforementioned resist cover film component may be eluted with pure water being poured onto the substrate W and kept thereon for a certain period. The supply of the cleaning liquid onto the substrate W may also be executed by a soft spray method using a two-fluid nozzle as shown in FIG. 8.

After the elapse of a predetermined time, the supply of the cleaning liquid is stopped, and the rinse liquid is discharged from the nozzle 650. The cleaning liquid on the substrate W is thus cleaned away.

Figure 13:
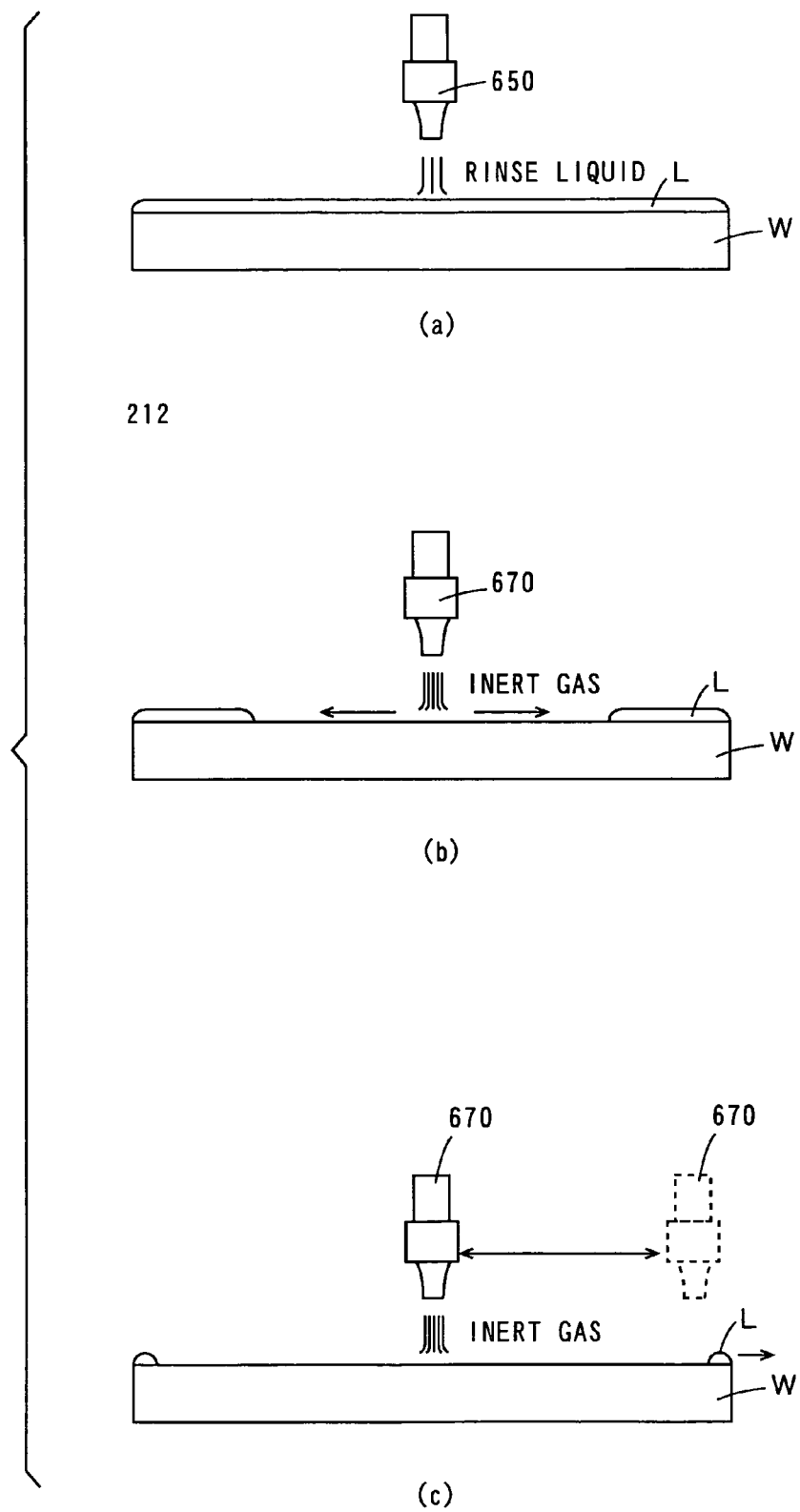
FIG. 13 is a diagram for use in illustrating the operation of the cleaning/drying processing unit.

After the elapse of another predetermined time, the rotation speed of the rotation shaft 625 decreases. This reduces the amount of the rinse liquid that is shaken off by the rotation of the substrate W, resulting in the formation of a liquid layer L of the rinse liquid over the entire main surface of the substrate W, as shown in FIG. 13 (a). Alternatively, the rotation of the rotation shaft 625 may be stopped to form the liquid layer L over the entire main surface of the substrate W.

The supply of the rinse liquid is subsequently stopped, and the nozzle 650 retracts to the predetermined position while the nozzle 670 moves above the center of the substrate W. The inert gas is subsequently discharged from the nozzle 670. This causes the rinse liquid around the center of the substrate W to move toward the peripheral portion of the substrate W, leaving the liquid layer L only on the peripheral portion, as shown in FIG. 13 (b).

Next, as the number of revolutions of the rotation shaft 625 (see FIG. 12) increases, the nozzle 670 gradually moves from above the center of the substrate W to above the peripheral portion thereof, as shown in FIG. 13 (c). This causes a great centrifugal force acting on the liquid layer L on the substrate W while allowing the inert gas to be sprayed toward the entire main surface of the substrate W, thereby ensuring the removal of the liquid layer L on the substrate W. As a result, the substrate W can be reliably dried.

Then, the supply of the inert gas is stopped, and the nozzle 670 retracts to the predetermined position while the rotation of the rotation shaft 625 is stopped. After this, the guard 624 is lowered, and the interface transport mechanism IFR in FIG. 1 carries the substrate W out of the cleaning/drying processing unit SD. The processing operation of the cleaning/drying processing unit SD is thus completed. It is preferred that the position of the guard 624 during cleaning and drying processing is suitably changed according to the necessity of the recovery or discharge of the processing liquid.

According to the above embodiment, although the configuration of sharing the nozzle 650 for the supply of both the cleaning liquid and the rinse liquid is adopted to allow either of the cleaning liquid and the rinse liquid to be supplied from the nozzle 650, the configuration of using the nozzle separately for the cleaning liquid and the rinse liquid may be also adopted.

In the case of supplying the rinse liquid, pure water may be also supplied from a nozzle for a back rinse that is not illustrated to the back of the substrate W so as to prevent the rinse liquid from flowing around to the back of the substrate W.

In the case of using pure water that cleans the substrate W, it is not necessary to supply the rinse liquid.

Although in the above-described embodiment, the substrate W is subjected to the drying processing by a spin drying method, the substrate W may be also subjected to the drying processing by other methods such as a reduced pressure drying method and an air knife drying method.

Although in the above-described embodiment, the inert gas is supplied from the nozzle 670 with the liquid layer L of the rinse liquid formed, the inert gas may be supplied from the nozzle 670 and the substrate W may be thoroughly dried immediately after the liquid layer of the cleaning liquid is shaken off once by rotating the substrate W when the liquid layer L of the rinse liquid is not formed or the rinse liquid is not used.

(6) Interface Transport Mechanism of the Interface Block

Figure 14:
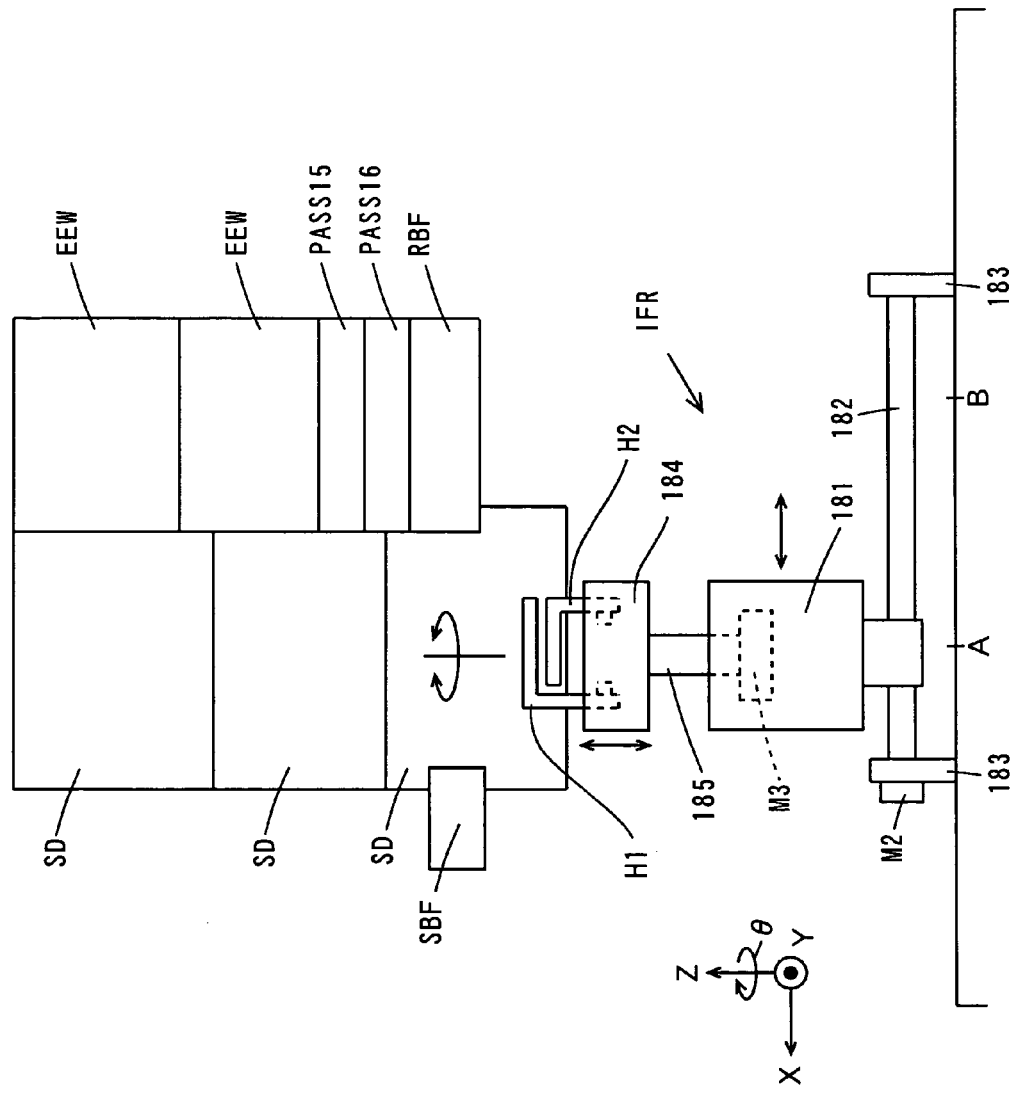
FIG. 14 is a diagram for use in illustrating the configuration and the operation of the interface transport mechanism.

The interface transport mechanism IFR is described. FIG. 14 is a diagram for illustrating the configuration and the operation of the interface transport mechanism IFR.

The configuration of the interface transport mechanism IFR is first described. As shown in FIG. 14, a movable base 181 in the interface transport mechanism IFR is threadably mounted to a screwed shaft 182. The screwed shaft 182 is rotatably supported with support bases 183 so as to extend in the X direction. One end of the screwed shaft 182 is provided with a motor M2, which causes the screwed shaft 182 to rotate and the movable base 181 to move horizontally in the ±X-direction.

Also, a hand support base 184 is mounted on the movable base 181 so as to rotate in the ±θ direction and move up and down in the ±Z direction. The hand support base 184 is coupled to a motor M3 in the movable base 181 through a rotation shaft 185 and rotated by the motor M3. Two hands H1, H2 for holding the substrate W in a horizontal attitude are provided to the hand support base 184 one above the other so as to move forward and backward.

The operation of the interface transport mechanism IFR is next described. The operation of the interface transport mechanism IFR is controlled by the main controller 81 in FIG. 1.

The interface transport mechanism IFR initially rotates the hand support base 184 at a position A in FIG. 14 while lifting the hand support base 184 in the +Z direction, to allow the upper hand H1 to enter the substrate platform PASS15. When the hand H1 has received the substrate W in the substrate platform PASS15, the interface transport mechanism IFR retracts the hand H1 from the substrate platform PASS15 and lowers the hand support base 184 in the −Z direction.

The interface transport mechanism IFR then moves in the −X direction, and rotates the hand support base 184 at a position B while allowing the hand H1 to enter the substrate inlet 17a in the exposure device 17 (see FIG. 1). After carrying the substrate W into the substrate inlet 17a, the interface transport mechanism IFR retracts the hand H1 from the substrate inlet 17a.

The interface transport mechanism IFR subsequently allows the lower hand H2 to enter the substrate outlet 17b (see FIG. 1). When the hand H2 has received the substrate W after the exposure processing from the substrate outlet 17b, the interface transport mechanism IFR retracts the hand H2 from the substrate outlet 17b.

After that, the interface transport mechanism IFR moves in the +X direction, and rotates the hand support base 184 at the position A, while allowing the hand H2 to enter the cleaning/drying processing unit SD, and transfers the substrate W to the cleaning/drying unit SD. This causes the cleaning/drying processing unit SD to apply cleaning and drying processing to the substrate W after the exposure processing.

Then, the interface transport mechanism IFR allows the upper hand H1 to enter the cleaning/drying unit SD, and receives the substrate W after cleaning and drying processing from the cleaning/drying processing unit SD. The substrate W is mounted onto the upper substrate platform PASS16 by the interface transport mechanism IFR.

As mentioned above, if the exposure device 17 is not capable of receiving the substrate W, the substrate W is temporarily stored at the sending buffer unit SBF. Also, if the cleaning/drying unit SD is not capable of performing cleaning and drying processing temporarily, the substrate W after the exposure processing is temporarily stored in the return buffer unit RBF in the interface block 15.

Although the single interface transport mechanism IFR transports the substrate W from the substrate platform PASS15 to the exposure device 17 and from the exposure device 17 to the cleaning/drying processing unit SD in this embodiment, a plurality of interface transport mechanisms IFR may be used for transporting the substrate W.

(7) Effects According to the First Embodiment (7-a) Effects of the Edge-Cleaning Processing As mentioned above, in the substrate processing apparatus 500 according to this embodiment, the edge R of the substrate W before the exposure processing is cleaned by the edge-cleaning unit EC in the edge-cleaning processing group 90 of the edge-cleaning processing block 9, thereby removing contaminants adhering to the edge R of the substrate W before the exposure processing. This can prevent contamination inside the exposure device resulting from contamination of the edge R of the substrate W and a defective dimension and a defective shape of the exposure pattern.

(7-b) Effects Related to Timing of the Edge-Cleaning Processing

The edge-cleaning processing block 9 is provided adjacent to the indexer block 8 into which the substrate W is carried, and the edge-cleaning processing to the substrate W in the edge-cleaning processing block 9 is performed in advance of other processing in other blocks.

This prevents contaminants adhering to the edge R of the substrate W from being transferred to the first to eighth central robots CR1 to CR8 for transporting the substrate W between each block and the hands IRH1 to IRH14, H1 and H2 of the interface transport mechanism IFR.

Accordingly, the processing to the substrate W is performed cleanly in the anti-reflection film processing block 10, the resist film processing block 11, the development processing block 12, the resist cover film processing block 13, the resist cover film removal block 14 and the cleaning/drying processing block 15.

In addition, since the edge R of the substrate W is kept clean, processing defects of the substrate W resulting from the contamination of the edge R of the substrate W are sufficiently prevented.

(7-c) Effects of the Edge-Cleaning Processing Block

The edge-cleaning processing block 9 including the edge-cleaning unit EC is arranged between other blocks (between the indexer block 8 and the anti-reflection film processing block 10).

As a result of the foregoing, since the substrate processing apparatus 500 according to this embodiment has the configuration in which the edge-cleaning processing block 9 is added to an existing substrate processing apparatus, the contamination inside the exposure device resulting from contamination of the edge R of the substrate W before the exposure processing can be prevented at a lower cost.

(7-d) Effects of the Hands of the First Central Robot

In the edge-cleaning processing block 9, when the unprocessed substrate W is transported from the substrate platform PASS81 to the edge-cleaning processing group 90, the lower hand CRH92 of the first central robot CR1 is used, and when the edge-cleaning processed substrate W is transported from the edge-cleaning processing group 90 to the thermal processing groups 900 or 901 for post edge-cleaning and the unprocessed substrate W is transported from the thermal processing groups 900 or 901 for post edge-cleaning to the substrate platform PASS1, the upper hand CRH91 of the first central robot CR1 is used.

That is, the hand CRH91 is used for transporting the substrate W with the cleaned edge R while the hand CRH92 is used for transporting the substrate W with the uncleaned edge R.

In this case, the contaminants adhering to the edge R of the substrate W are prevented from adhering to the hand CRH91 in the edge-cleaning processing block 9. Also, since the hand CRH92 is provided below the hand CRH91, the contaminants are prevented from adhering to the hand CRH91 and the substrate W held thereby even if the contaminants drop from the hand CRH92 and the edge R of the substrate W held thereby.

This can reliably prevent the contaminants from adhering to the substrate W before the exposure processing. As a result, contamination of the substrate W before the exposure processing can be reliably prevented.

(7-e) Effects of the Edge-Cleaning Processing Using the Brush

In the edge-cleaning unit EC, since the brush 213 is brought into directly contact with the edge R of the substrate W in a case where the edge-cleaning processing is applied to the substrate W using the brush 213 as shown in FIG. 4 and FIG. 6, the contaminants of the edge R of the substrate W can be physically stripped off. This enables removal of the contaminants firmly adhering to the edge R reliably.

(7-f) Effects of the Edge-Cleaning Processing Using the Two-Fluid Nozzle

When the edge-cleaning processing is applied to the substrate W using the two-fluid nozzle 310 in the edge-cleaning unit EC as shown in FIGS. 7 to 9, the fluid mixture N of a gas and a liquid is discharged to the edge R of the substrate W, thereby cleaning the edge R of the substrate W. In this manner, high cleaning effects can be obtained by using the fluid mixture N.

Also, the edge R of the substrate W is cleaned without anything in contact by discharging the fluid mixture to the edge R, damage of the edge R of the substrate W is avoided during cleaning. In addition, it is possible to easily control the condition of cleaning the edge R of the substrate W by controlling the discharge pressure of the fluid mixture N and the ratio between the gas and the liquid therein.

Moreover, since the two-fluid nozzle 310 makes it possible to discharge the uniform fluid mixture N onto the edge R of the substrate W, nonuniform cleaning is avoided.

(7-g) Effects of the Edge-Cleaning Processing Using the Ultrasonic Nozzle

When the edge-cleaning processing is applied to the substrate W with the ultrasonic nozzle 410 as shown in FIG. 10 in the edge-cleaning unit EC, high-frequency power corresponding to the value of a high-frequency electric current is applied to pure water passing through the ultrasonic nozzle 410.

This causes the pure water in a state of ultrasonic vibration to be discharged to the edge R of the substrate W, thereby cleaning the edge R of the substrate W. In this case, it is possible to electrically control the high-frequency power applied to the pure water variably depending on the type of the substrate W and cleaning conditions.

(7-h) Effects of Cleaning Processing of the Substrate after the Exposure Processing After the exposure processing is applied to the substrate W in the exposure device 17, the cleaning processing to the substrate W is performed in the cleaning/drying processing unit 80 of the cleaning/drying processing block 15. In this case, even if particles and the like in the atmosphere adheres to the substrate W to which a liquid adheres during the exposure processing, the attachment can be removed. This prevents contamination of the substrate W.

Also, the drying processing of the substrate W after the exposure processing is performed in the cleaning/drying processing unit 80. This prevents the liquid adhering to the substrate W after the exposure processing from dropping in the substrate processing apparatus 500. As a result, this prevents operational troubles such as abnormalities in the electric system of the substrate processing apparatus 500.

Moreover, drying the substrate W after the exposure processing prevents particles and the like in the atmosphere from adhering to the substrate W after the exposure processing, thereby preventing the substrate W from being contaminated.

Since the substrate W to which a liquid adheres is prevented from being transported, it is possible to prevent the liquid adhering to the substrate W during the exposure processing from influencing the atmosphere in the substrate processing apparatus 500. This facilitates the adjustment of the temperature and humidity in the substrate processing apparatus 500.

Furthermore, since the liquid adhering to the substrate W during the exposure processing is prevented from adhering to the indexer robot IR and the central robots CR1 to CR8, the liquid is prevented from adhering to the substrate W before the exposure processing. This prevents particles and the like in the atmosphere from adhering to the substrate W before the exposure processing, thereby preventing the contamination of the substrate W. Consequently, this prevents degradation in the resolution performance during the exposure processing and ensures prevention of contamination in the exposure device 17.

As a result of the foregoing, prevention of processing defects in the substrate W can be ensured.

Note that the configuration for performing the drying processing on the substrate W after the exposure processing is not limited to the example of the substrate processing apparatus 500 in FIG. 1. Instead of providing the cleaning/drying processing block 15 between the resist cover film removal block 14 and the interface block 16, it may be possible to provide the cleaning/drying processing unit 80 in the interface block 16 and apply the drying processing to the substrate W after the exposure processing.

(7-i) Effects of Drying Processing of the Substrate after Exposure Processing

The cleaning/drying processing unit SD applies the drying processing to the substrate W by spraying the inert gas onto the substrate W from the center to the peripheral portion thereof while rotating the substrate W. This ensures that the cleaning liquid and the rinse liquid are removed from the substrate W, which reliably prevents the attachment of particles and the like in the atmosphere on the cleaned substrate W. It is thus possible to reliably prevent the contamination of the substrate W and the generation of dry marks on the main surface of the substrate W.

(7-j) Effects of the Cleaning/Drying Processing Block

Since the substrate processing apparatus 500 according to this embodiment has the configuration in which the cleaning/drying processing block 15 is added to an existing substrate processing apparatus, processing defects of the substrate W can be prevented at a lower cost.

(7-k) Effects of the Hands of Interface Transport Mechanism

When transporting the substrate W before the exposure processing from the substrate platform PASS15 to the substrate inlet 17a of the exposure device 17 and when transporting the substrate W after cleaning and drying processing from the cleaning/drying processing unit SD to the substrate platform PASS16 in the interface block 16, the interface transport mechanism IFR employs the hand H1. When transporting the substrate W after the exposure processing from the substrate outlet 17b of the exposure device 17 to the cleaning/drying processing unit SD, the interface transport mechanism IFR employs the hand H2.

This is, the hand H1 is used for transporting the substrate W to which no liquid adheres while the hand H2 is used for transporting the substrate W to which a liquid adheres.

Since the liquid adhering to the substrate W during the exposure processing is prevented from adhering to the hand H1, a liquid is prevented from adhering to the substrate W before the exposure processing. Also, since the hand H2 is provided below the hand H1, a liquid is prevented from adhering to the hand H1 and the substrate W held thereby even if a liquid drops from the hand H2 and the substrate W held thereby. This can reliably prevent the liquid from adhering to the substrate W before the exposure processing. As a result, contamination of the substrate W before the exposure processing can be reliably prevented.

(7-l) Effects of Coating Processing of the Resist Cover Film

Before the exposure processing is performed on the substrate W in the exposure device 17, the resist cover film is formed on the resist film in the resist cover processing block 13. In this case, even if the substrate W is brought into contact with a liquid in the exposure device 17, the resist cover film prevents the contact of the resist film with the liquid, which prevents a component from being eluted in the liquid.

(7-m) Effects of Removal Processing of the Resist Cover

Before development processing is applied to the substrate W in the development processing block 12, resist cover removal processing is performed in the resist cover removal block 14. In this case, the resist cover film is reliably removed before the development processing, which allows the development processing to be reliably performed.

(7-n) Effects of the Cleaning/Drying Processing Unit

As mentioned above, since the drying processing of the substrate W is performed by spraying the inert gas from the center of the substrate W to its peripheral portion while rotating the substrate W in the cleaning/drying processing unit SD, the cleaning liquid and the rinse liquid can be reliably removed.

This can reliably prevent the component of the resist film and the resist cover film from being eluted in the cleaning liquid and the rinse liquid remaining on the substrate W when the substrate W is transported from the cleaning/drying processing unit 80 to the development processing unit 50. This can prevent the deformation of exposure patterns formed on the resist film. As a result, degradation in accuracy of linewidth during the development processing is reliably prevented.

(7-o) Effects of Hands of Robots

In the second to sixth central robots CR2 to CR6 and the indexer robot IR, the upper hand is used for transporting the substrate W before the exposure processing while the lower hand is used for transporting the substrate W after the exposure processing. This can reliably prevent a liquid from adhering to the substrate W before the exposure processing.

(8) Modifications of the Substrate Processing Apparatus According to the First Embodiment and Effects Thereof (8-a) Cleaning Processing of Substrates Before Exposure Processing In the substrate processing apparatus 500 according to the first embodiment, cleaning processing to the substrate W may be performed before the exposure processing. In this case, cleaning and drying processing to the substrate W before the exposure processing is performed in the cleaning/drying processing unit 80 in the cleaning/drying processing block unit 15, for example. This enables the removal of the particles and the like adhering to the substrate W before the exposure processing. Consequently, contamination in the exposure device 17 can be avoided.

Also, the drying processing of the substrate W is performed in the cleaning/drying processing unit 80 after the cleaning processing. This removes the cleaning liquid or the rinse liquid adhering to the substrate W during the cleaning processing, which prevents the particles and the like in the atmosphere from adhering to the substrate W after the cleaning processing again. As a result, contamination in the exposure device 17 can be reliably prevented.

Before the exposure processing is applied to the substrate W in the exposure device 17 after the formation of the resist cover film, the cleaning processing to the substrate W is performed in the cleaning/drying processing unit 80. At this time, part of a component of the resist cover film formed on the substrate W is eluted in the cleaning liquid. Even if the substrate W is brought into contact with the liquid in the exposure device 17, the component of the resist cover film is prevented from being eluted in the liquid.

As a result of the foregoing, contamination in the exposure device 17 can be reliably prevented while the component of the resist film and the resist cover film are prevented from remaining on the main surface of the substrate W. This ensurely prevents processing defects of the substrate W from being generated.

Moreover, cleaning and drying processing of the substrate W may be performed by providing the cleaning/drying processing unit 80 in the interface block 16.

(8-b) Resist Cover Processing Block

In the case of performing cleaning processing to the substrate W before the exposure processing, the resist cover film processing block 13 may not be provided. In this case, part of a component of the resist is eluted in the cleaning liquid during the cleaning processing in the cleaning/drying processing unit 80 in which the cleaning processing to the substrate W is performed before the exposure processing. Even if the resist film is brought into contact with the liquid in the exposure device 17, the component of the resist is prevented from being eluted in the liquid. As a result, contamination in the exposure device 17 can be prevented.

Furthermore, where the resist cover film removal processing block 13 is not provided, the resist cover film removal block 14 is not needed. Therefore, the footprint of the substrate processing apparatus 500 can be reduced.

(8-c) Water-Resistant Substrate Processing Apparatus

If the substrate processing apparatus 500 has sufficient waterproofing function, the cleaning/drying processing unit 80 may not be provided. This causes the footprint of the substrate processing apparatus 500 to be reduced. Also, since transporting the substrate W to the cleaning/drying processing unit 80 after the exposure processing is omitted, the productivity of the substrate W is improved.

(8-d) Other Arrangements

According to the above embodiment, while the resist cover film removal block 14 includes the two resist cover film removal processing groups 70a, 70b, the resist cover film removal block 14 may include a thermal processing group that applies thermal processing to the substrate W instead of either of the two resist cover film removal processing groups 70a, 70b. In this case, since the thermal processing is applied to a plurality of the substrates W effectively, the throughput is improved.

(8-e) Other Examples of the Cleaning/Drying Processing Unit

Although the cleaning/drying processing unit SD shown in FIG. 12 includes the nozzle 650 for cleaning processing and the nozzle 670 for drying processing separately, the nozzle 650 and the nozzle 670 may also be formed integrally, as shown in FIG. 15. This obviates the need to move each of the nozzle 650 and the nozzle 670 separately during the cleaning and drying processing to the substrate W, thereby simplifying the driving mechanism.

Figure 16:
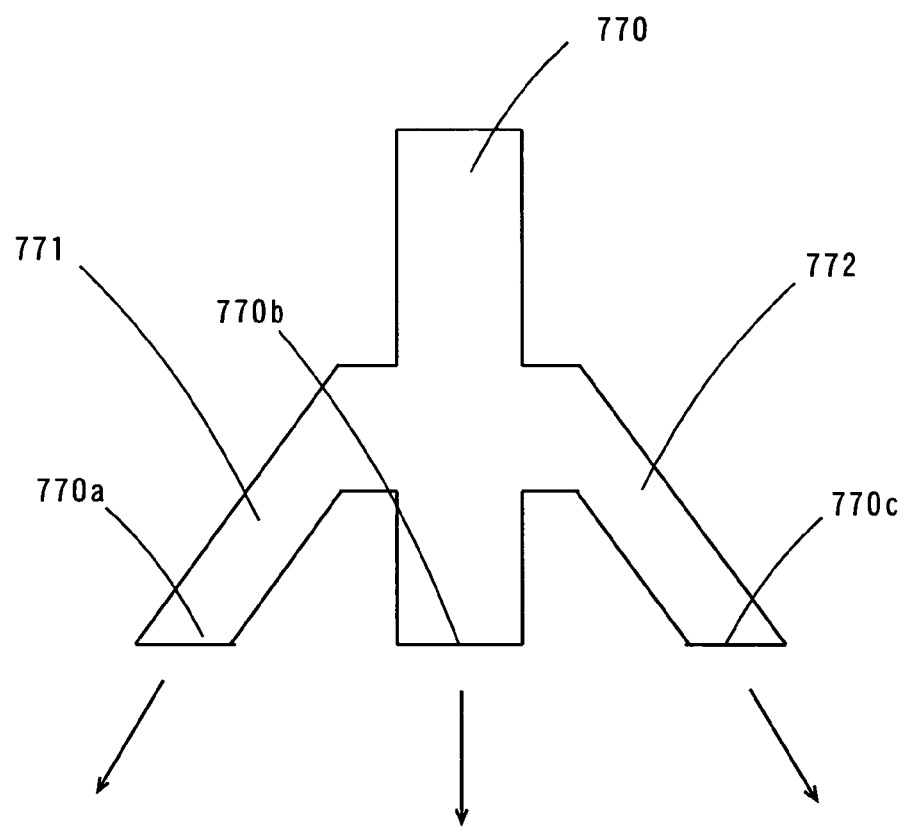
FIG. 16 is a schematic diagram showing another example of the nozzle for drying processing.

A nozzle 770 for drying processing shown in FIG. 16 may be used instead of the nozzle 670 for drying processing shown in FIG. 12.

The nozzle 770 shown in FIG. 16 extends vertically downward and also has branch pipes 771, 772 that extends obliquely downward from the sides thereof. A gas discharge port 770a is formed at the lower end of the branch pipe 771, a gas discharge port 770b at the lower end of the nozzle 770, and a gas discharge port 770c at the lower end of the branch pipe 772, each for discharging an inert gas. The discharge port 770b discharges an inert gas vertically downward, and the discharge ports 770a, 770c each discharge an inert gas obliquely downward, as indicated by the arrows in FIG. 16. That is to say, the nozzle 770 discharges the inert gas so as to increase the spraying area downwardly.

Now, a cleaning/drying processing unit SD using the nozzle 770 for drying processing applies the drying processing to the substrate W as will be described below.

Figure 17:
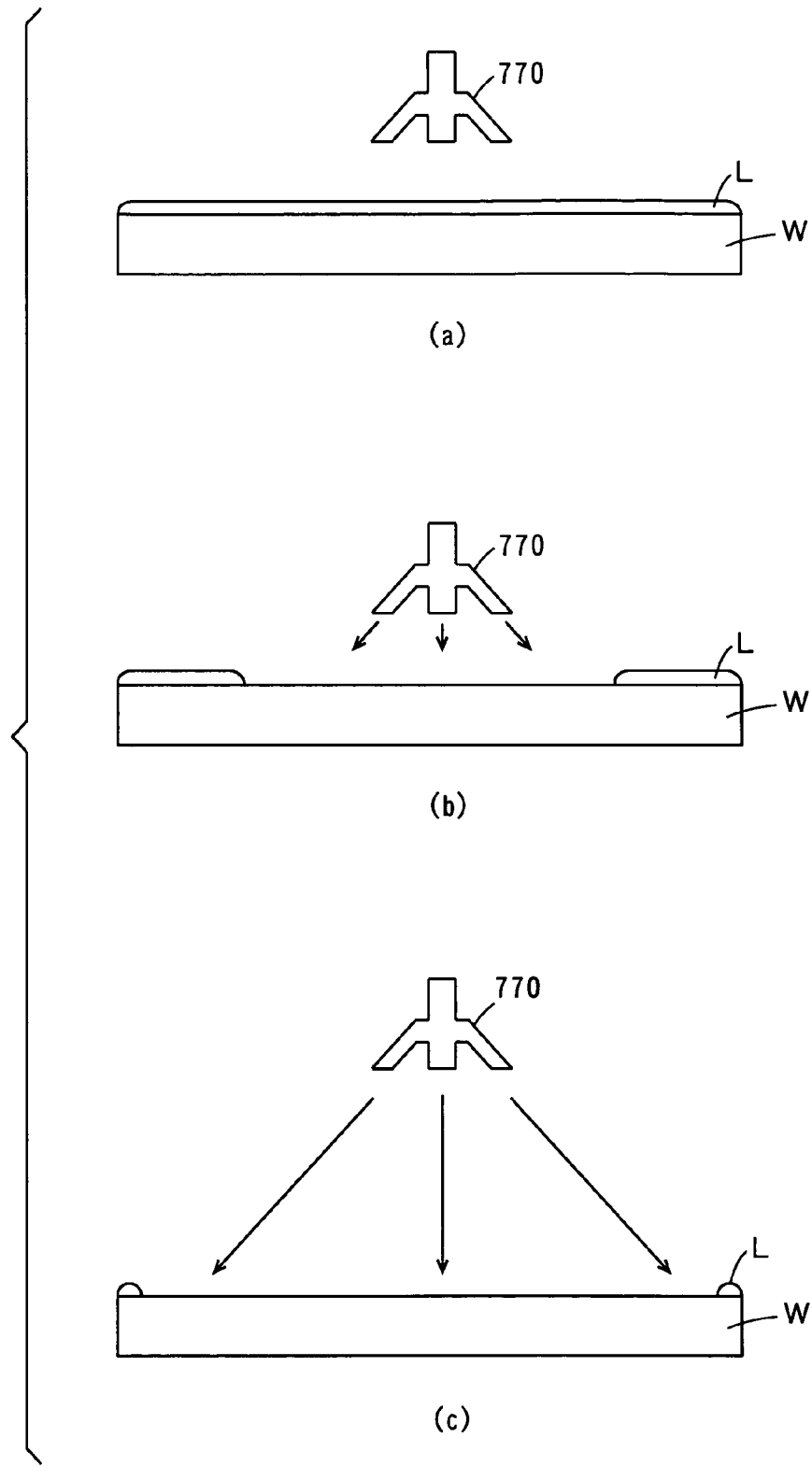
FIG. 17 is a diagram for use in illustrating a drying processing method of the substrate for the case of using the nozzle for drying processing in FIG. 16.

FIG. 17 is a diagram for use in illustrating a method of applying the drying processing to the substrate W using the nozzle 770.

Initially, a liquid layer L is formed on a main surface of the substrate W by the method as described in FIG. 13, and then the nozzle 770 moves above the center of the substrate W, as shown in FIG. 17(*a*). After this, an inert gas is discharged from the nozzle 770. This causes the rinse liquid on the center of the substrate W to move to the peripheral portion of the substrate W, leaving the liquid layer L only on the peripheral portion of the substrate W, as shown in FIG. 17 (*b*). At the time, the nozzle 770 is brought close to the main surface of the substrate W so as to reliably move the rinse liquid present on the center of the substrate W.

Next, as the number of revolutions of the rotation shaft 625 (see FIG. 12) increases, the nozzle 770 moves upward as shown in FIG. 17(*c*). This causes a great centrifugal force acting on the liquid layer L on the substrate W while increasing the area to which the inert gas is sprayed on the substrate W. As a result, the liquid layer L on the substrate W can be reliably removed. Note that the nozzle 770 can be moved up and down by lifting and lowering the second rotation shaft 672 via a rotation shaft lifting mechanism (not shown) provided to the second rotation shaft 672 in FIG. 12.

Figure 18:
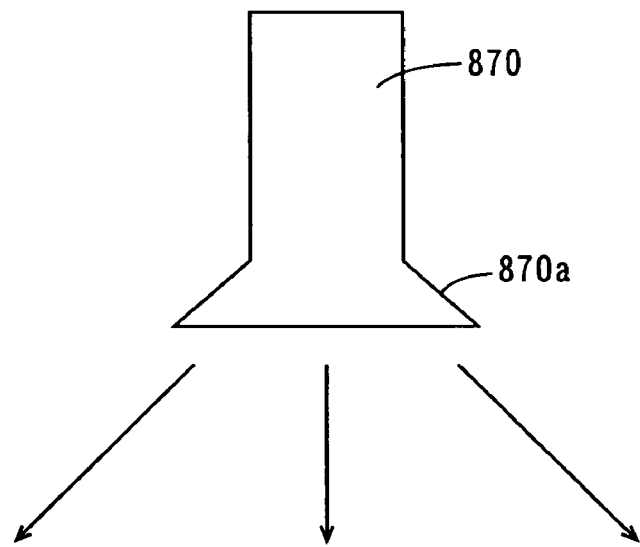
FIG. 18 is a schematic diagram showing another example of the nozzle for drying processing.

Alternatively, a nozzle 870 for drying processing as shown in FIG. 18 may be used instead of the nozzle 770. The nozzle 870 in FIG. 18 has a discharge port 870a whose diameter gradually increases downward. This discharge port 870a discharges an inert gas vertically downward and obliquely downward as indicated by the arrows in FIG. 18. That is, similarly to the nozzle 770 in FIG. 16, the nozzle 870 discharges the inert gas so as to increase the spraying area downwardly. Consequently, the drying processing similar to that using the nozzle 770 can be applied to the substrate W using the nozzle 870.

Figure 19:
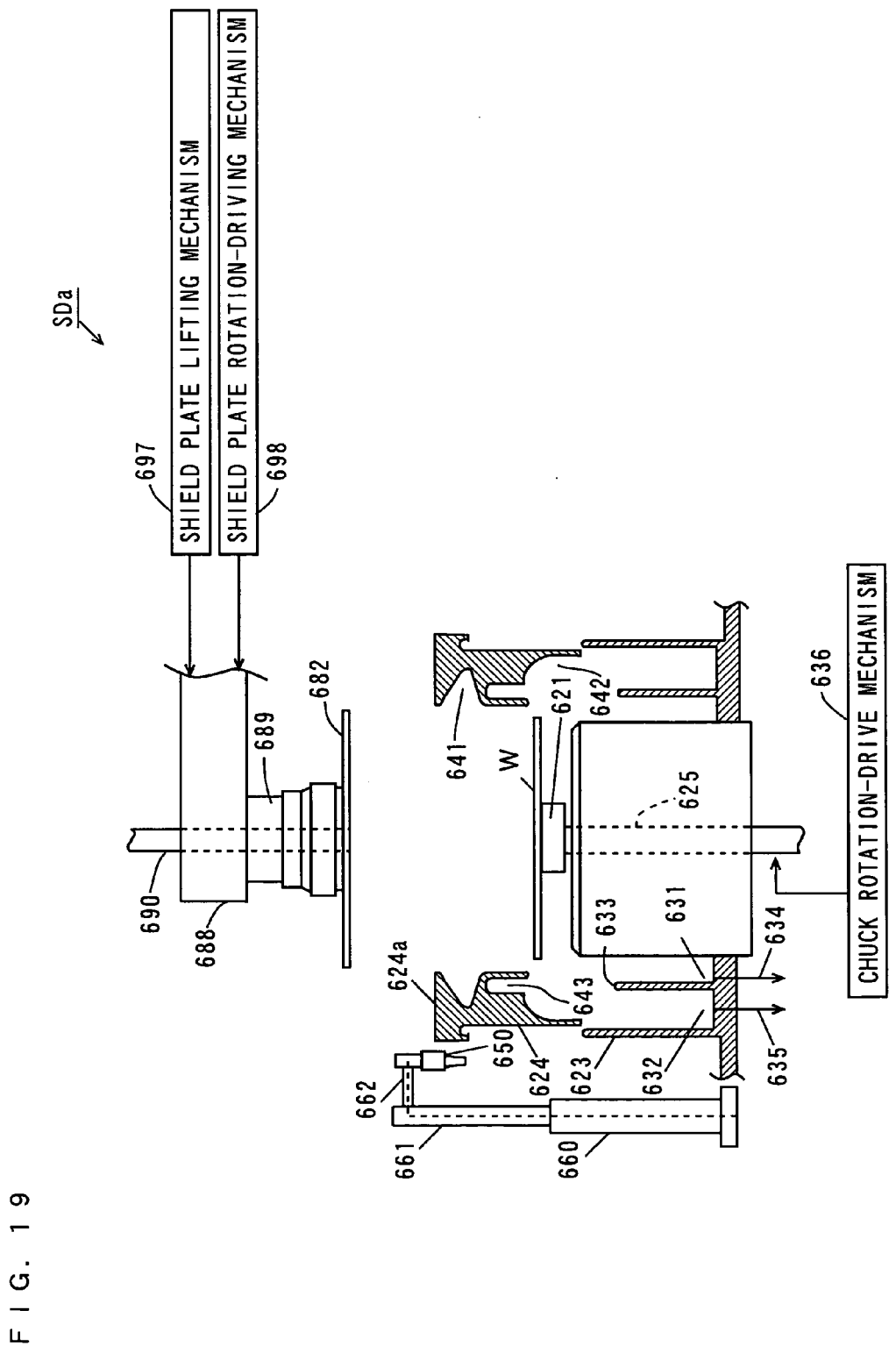
FIG. 19 is a schematic diagram showing another example of the cleaning/drying processing unit.

A cleaning/drying processing unit SDa as shown in FIG. 19 may also be used instead of the cleaning/drying processing unit SD shown in FIG. 12.

The cleaning/drying processing unit SDa in FIG. 19 is different from the cleaning/drying processing unit SD in FIG. 12 as described below.

The cleaning/cleaning processing unit SDa in FIG. 19 includes above the spin chuck 621 a disk-shaped shield plate 682 having an opening through the center thereof. A support shaft 689 extends vertically downward from around an end of an arm 688, and the shield plate 682 is mounted at a lower end of the support shaft 689 so as to oppose the main surface of the substrate W held on the spin chuck 621.

A gas supply passage 690 that communicates with the opening of the shield plate 682 is inserted into the inside of the support shaft 689. A nitrogen gas ($N_2$), for example, is supplied into the gas supply passage 690.

The arm 688 is connected with a shield plate lifting mechanism 697 and a shield plate rotation-driving mechanism 698.

The shield plate lifting mechanism 697 lifts and lowers the shield plate 682 between a position close to the main surface of the substrate W held on the spin chuck 621 and a position upwardly away from the spin chuck 621.

Figure 20:
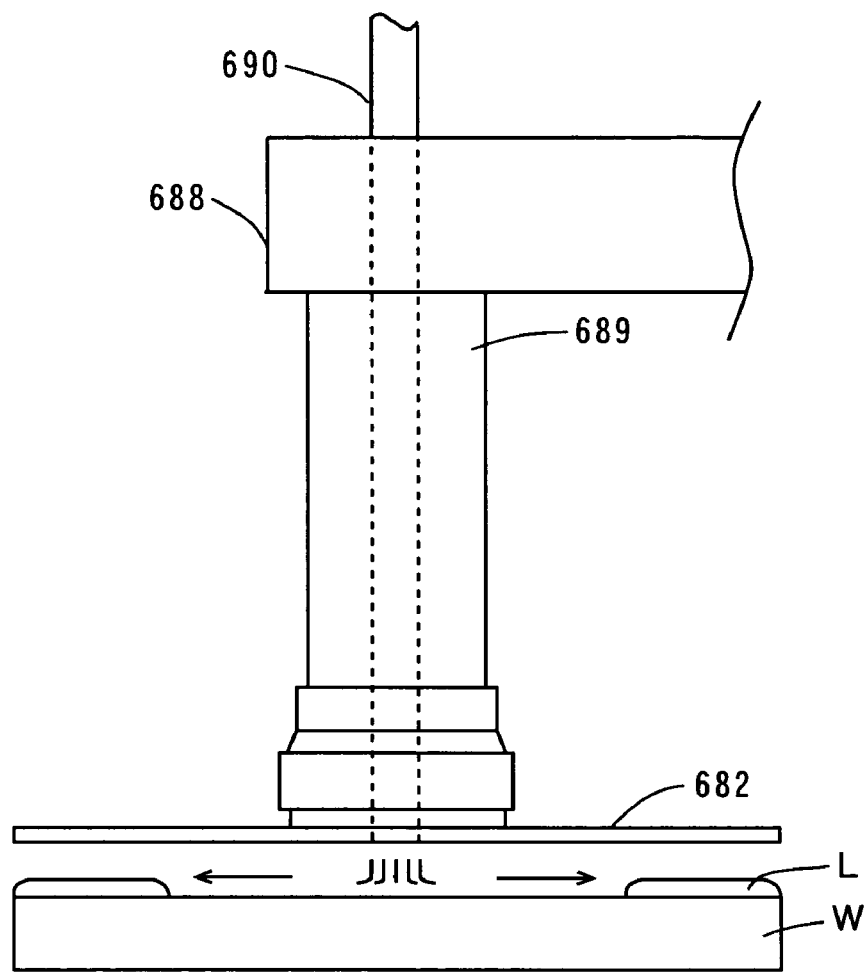
FIG. 20 is a diagram for illustrating the drying processing method for the case of using the cleaning/drying processing unit in FIG. 19.

During the drying processing to the substrate W in the cleaning/drying processing unit SDa in FIG. 19, with the shield plate 682 brought close to the substrate W as shown in FIG. 20, an inert gas is supplied to clearance between the substrate W and the shield plate 682 from the gas supply passage 690. This allows the inert gas to be efficiently supplied from the center of the substrate W to the peripheral portion thereof, thereby ensuring the removal of the liquid layer L on the substrate W.

B. The Second Embodiment

The substrate processing apparatus according to the second embodiment is different from the substrate processing apparatus 500 according to the first embodiment as described below.

(1) Configuration of the Substrate Processing Apparatus

FIG. 21 is a schematic plan view of a substrate processing apparatus according to the second embodiment.

As shown in FIG. 21, the edge-cleaning processing block 9 of the substrate processing apparatus 500 according to the first embodiment is not provided in the substrate processing apparatus 500 according to this embodiment. Therefore, the indexer block 8 is provided adjacent to the anti-reflection film processing block 10.

A partition wall 20 is thus arranged between the indexer block 8 and the anti-reflection film processing block 10 for shielding an atmosphere. The partition wall 20 has substrate platforms PASS1, PASS2 provided closely one above the other for receiving and transferring the substrates W between the indexer block 9 and the anti-reflection film processing block 10. The upper substrate platform PASS1 is used in transferring the substrate W from the indexer block 8 to the anti-reflection film processing block 10, and the lower substrate platform PASS2 is used in transferring the substrate W from the anti-reflection film processing block 10 to the indexer block 8.

Figure 22:
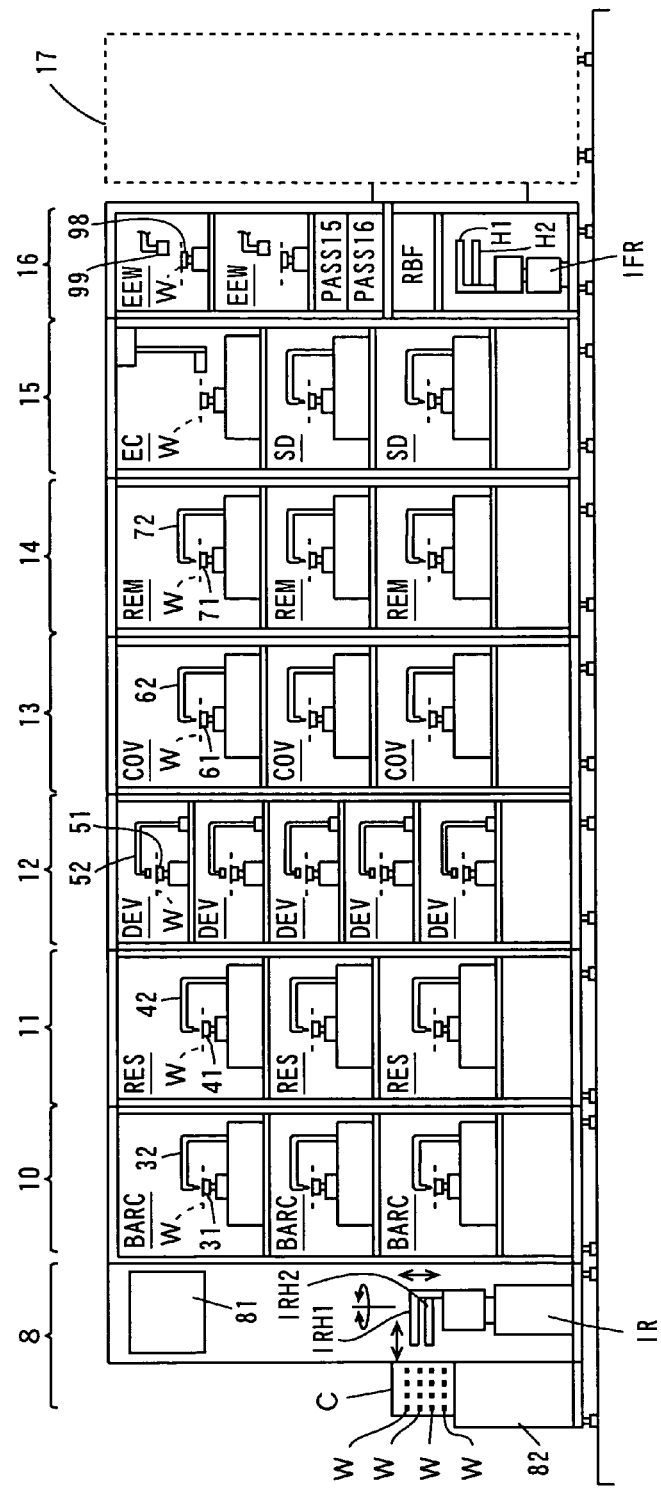
FIG. 22 is a side view of the substrate processing apparatus in FIG. 21 that is seen from the +X direction.
Figure 23:
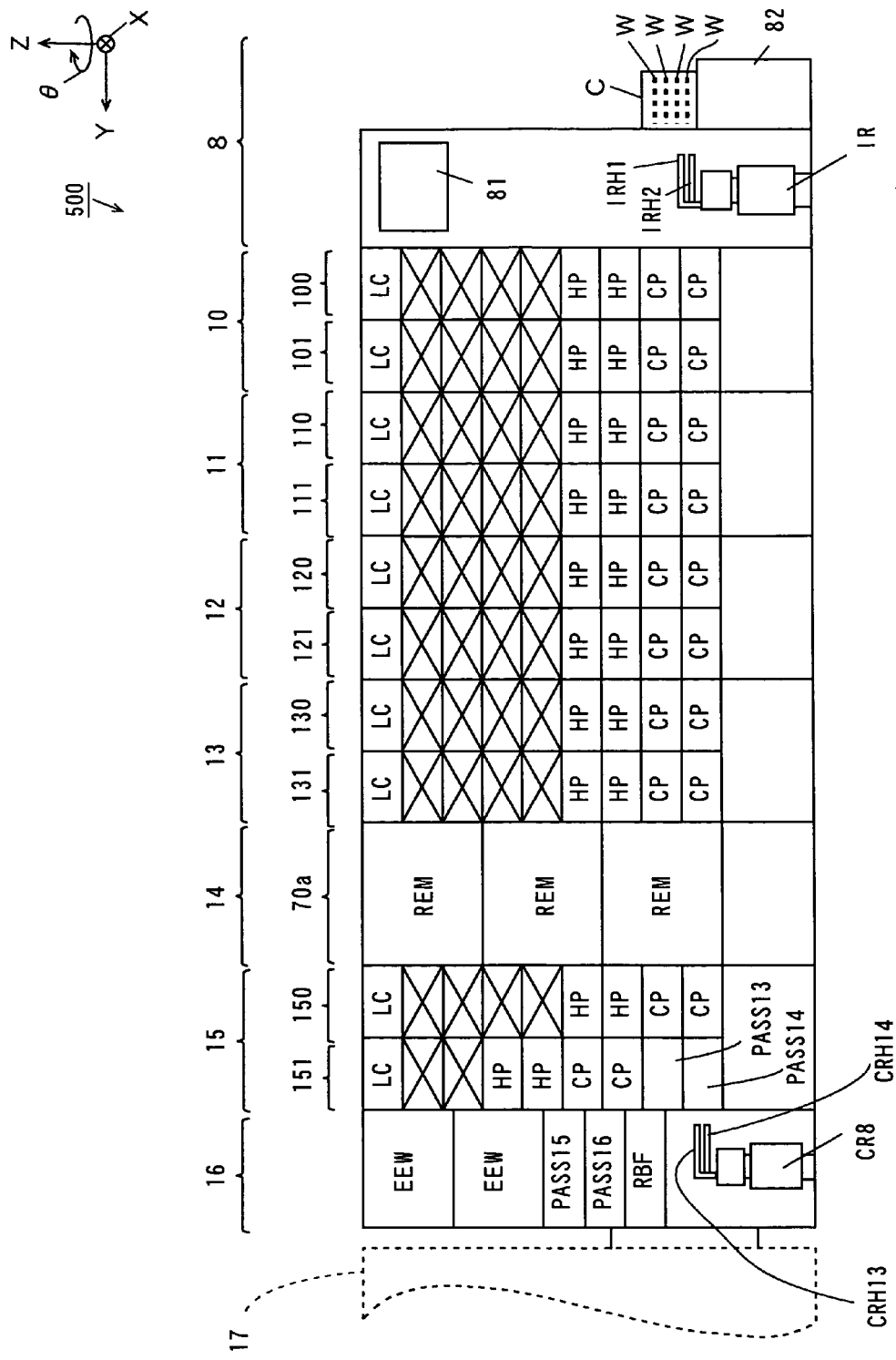
FIG. 23 is a side view of the substrate processing apparatus in FIG. 21 that is seen from the −X direction.

FIG. 22 is a side view of the substrate processing apparatus 500 in FIG. 21 that is seen from the +X direction, and FIG. 23 is a side view of the substrate processing apparatus 500 in FIG. 21 that is seen from the −X direction.

As mentioned above, in the substrate processing apparatus 500 according to this embodiment, the indexer block 8 is provided adjacent to the anti-reflection film processing block 10.

Also, as shown in FIG. 23, in the substrate processing apparatus 500 according to the embodiment, the cleaning/drying processing group 80 in the cleaning/drying processing block 15 (see FIG. 1) has a vertical stack of one edge-cleaning unit EC and two cleaning/drying processing units SD in this order.

(2) Operation of the Substrate Processing Apparatus

Next, the operation of the substrate processing apparatus 500 according to this embodiment is different from that of the substrate processing apparatus 500 according to the first embodiment as described below with reference to FIGS. 21 to 23.

Similarly to the first embodiment, carriers C for storing substrates W in multiple stages are mounted on the carrier platform 82 in the indexer block 8. The indexer robot IR takes out a substrate W yet to be processed that is stored in a carrier C using the upper hand IRH1. Then, the indexer robot IR moves in the ±X direction while rotating in the ±θ direction to transfer the unprocessed substrate W onto the substrate platform PASS1.

The substrate W that has been transferred onto the substrate platform PASS1 is received by the second central robot CR2 in the anti-reflection film processing block 10. The second central robot CR2 carries the substrate W into the coating processing group 30. The application of processing to the substrate W in the coating processing group 30 is similar to that in the first embodiment.

The second central robot CR2 subsequently takes out the substrate W after coating processing from the coating processing group 30, and carries the substrate W into the thermal processing group 100 or 101.

Then, the second central robot CR2 takes out the thermally processed substrate W from the thermal processing group 100 or 101, and transfers the substrate W onto the substrate platform PASS3.

After that, the substrate W is transferred onto the substrate platform PASS11 by the third to sixth central robots CR3 to CR6 similarly to the first embodiment.

The substrate W on the substrate platform PASS11 is received by the seventh central robot CR7 in the cleaning/drying processing block 15.

In this embodiment, before the exposure processing by the exposure device 17, the after-mentioned edge-cleaning processing is applied to the substrate W. The seventh central robot CR7 carries the supplied substrate W into the edge-cleaning unit EC in the cleaning/drying processing group 80. The edge-cleaning processing is applied to the substrate W carried into the edge-cleaning unit EC.

The seventh central robot CR7 then takes out the substrate W after the edge-cleaning processing from the edge-cleaning unit EC, and transfers the substrate W to the substrate platform PASS13.

The substrate W on the substrate platform PASS13 is received by the eighth central robot CR8 in the interface block 16.

The eighth central robot CR8 carries the substrate W into an edge exposure unit EEW, takes out the substrate W after the exposure processing from the edge exposure unit EEW and transfers the substrate W to the substrate platform PASS15, similarly to the first embodiment.

The substrate W on the substrate platform PASS15 is carried into the substrate inlet 17a of the exposure device 17 (see FIG. 21) by the interface transport mechanism IFR.

After the exposure processing in the exposure device 17, the interface transport mechanism IFR takes out the substrate W from a substrate outlet 17b of the exposure device 17 (see FIG. 21) and carries the substrate W into the cleaning/drying processing group 80 in the cleaning/drying processing block 15. In a cleaning/drying processing unit SD in the cleaning/drying processing group 80, the substrate W after the exposure processing is subjected to the cleaning and drying processing.

After this, the substrate W is transported to the substrate platform 2 by the interface transport mechanism IFR and the second to eighth robots CR2 to CR8, similarly to the first embodiment.

The substrate W on the substrate platform PASS2 is stored in a carrier C by the indexer robot IR in the indexer block 8.

(3) Edge-Cleaning Unit

Now, the edge-cleaning unit EC used in this embodiment will be described in detail with reference to drawings. The operation of each component of the edge-cleaning unit EC is controlled by the main controller 81 provided in the indexer robot 8 in FIG. 21.

(3-a) One Example of the Configuration of the Cleaning/Drying Processing Unit In this embodiment, the edge-cleaning unit EC in FIG. 4 illustrated in the first embodiment can be used instead of the aforementioned edge-cleaning unit EC.

Normally, a resist cover film is often formed so as not to cover the aforementioned periphery of the substrate W. That is, one or both of the anti-reflection film and the resist film formed on the periphery of the substrate W are exposed.

In this embodiment, before the exposure processing by the exposure device 17 which is post-process, the edge-cleaning processing is applied to the substrate W by the edge-cleaning unit EC in the cleaning/drying processing group 80. The edge-cleaning processing is processing of eluting or extracting one or both of the components of the anti-reflection film and the resist film exposed in advance by cleaning the edge R of the substrate W (the bevel part and the periphery) with the immersion liquid used in the exposure device 17.

This prevents one or both of the components of the anti-reflection film and the resist film from being eluted or extracted in the immersion liquid when the exposure processing is performed by the exposure device 17.

Note that examples of the immersion liquid used during the edge-cleaning processing to the substrate W may include pure water, glycerol with a high refractive index, the mixture liquid of particles with a high refractive index (e.g. aluminum oxide) and pure water, organic liquids and the like.

In addition, other examples of the immersion liquid may include a pure water solution containing a complex (ionized), carbonated water, hydrogen water, electrolytic ionic water, HFE (hydrofluoroether), fluorinated acid, sulfuric acid, sulfuric acid/hydrogen peroxide mixture and the like.

(3-b) Another Example of the Configuration of the Edge-Cleaning Unit

Figure 24:
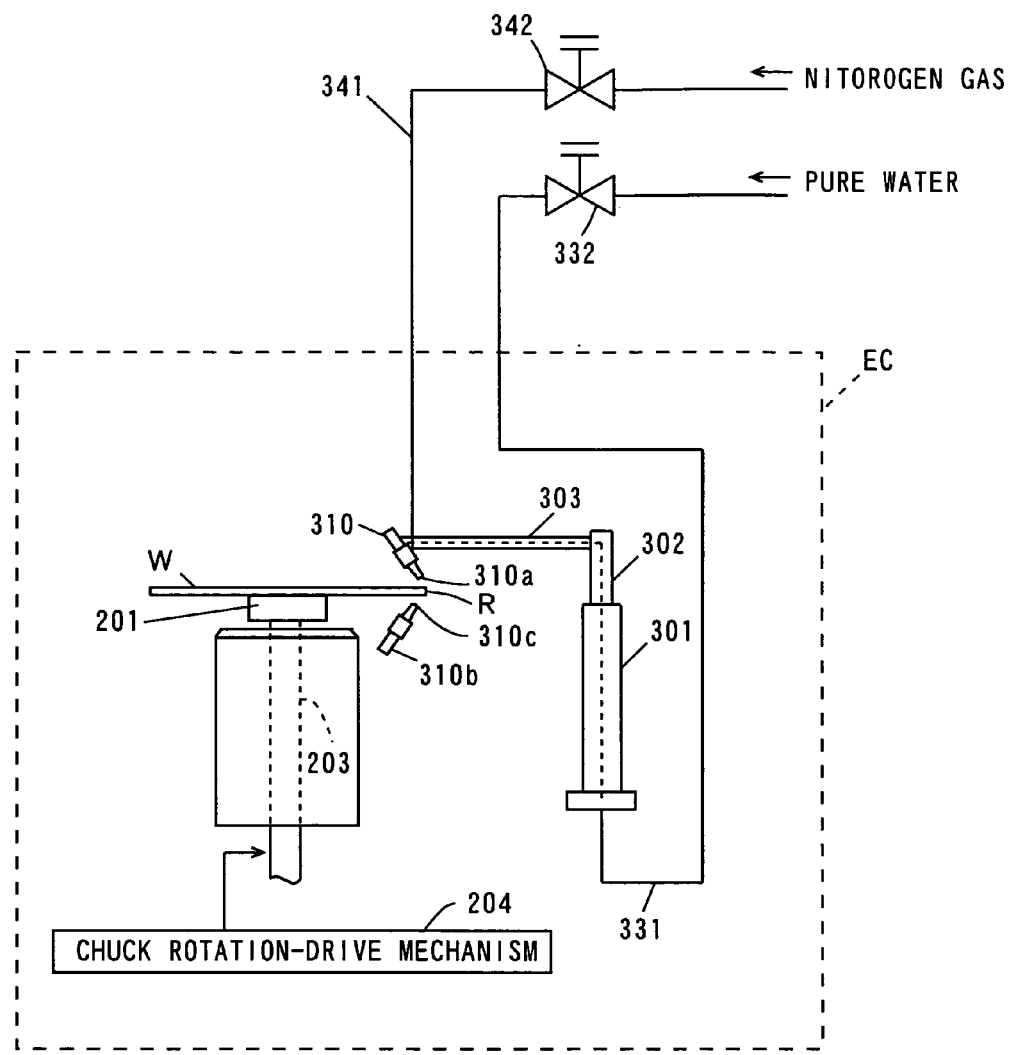
FIG. 24 is a diagram for use in illustrating another configuration example of the edge-cleaning unit used in the second embodiment.

The edge-cleaning unit EC may have the following configuration. FIG. 24 is a diagram for use in illustrating another example of the configuration of the edge-cleaning unit EC used in the second embodiment.

As shown in FIG. 24, the edge-cleaning unit EC of this example has almost the same configuration and operation as those of the edge-cleaning unit EC in FIG. 7 illustrated in the first embodiment.

Therefore, the edge-cleaning unit EC of this example is different from the edge-cleaning unit EC in FIG. 7 as described below.

In this embodiment, the two-fluid nozzle 310 is attached to the end of the arm 303 so as to be inclined outward to the main surface of the substrate W held by the spin chuck 201.

At the start of the edge-cleaning processing to the substrate W, the arm 303 swings while the rotation shaft 302 is rotated by the motor 301. This causes the two-fluid nozzle 310 to move above the edge R of the substrate W held by the spin chuck 201. As a result, the discharge port 310a of the fluid mixture of the two-fluid nozzle 310 is positioned opposite to the edge R of the substrate W.

In addition, by opening the valve 332, an immersion liquid as a cleaning liquid is supplied through the cleaning liquid supply pipe 331 to the two-fluid nozzle 310. Also, by opening the valve 342, a gas is supplied to the two-fluid nozzle 310.

During the edge-cleaning processing to the substrate W, the cleaning liquid and the gas are supplied to the two-fluid nozzle 310. This causes the two-fluid nozzle 310 to discharge the fluid mixture to the edge R of the substrate W rotating. The edge R of the substrate W is thus cleaned well.

Additionally, in this embodiment, a two-fluid nozzle 310b having the same configuration and function as those of the aforementioned two-fluid nozzle 310 is provided in the edge-cleaning unit EC. The two-fluid nozzle 310b is provided so as to be inclined outward to the back surface of the substrate W held by the spin chuck 201. Note that the two-fluid nozzle 310b includes a discharge port 310c that discharges the fluid mixture, and is attached to an arm that is not shown.

In this way, the two-fluid nozzles 310, 310b are provided so as to be opposite to the main surface and the back surface of the substrate W respectively, thereby making it possible to reliably clean the edge R of the substrate W. The description of each of the supply systems for a cleaning liquid and a gas for the two-fluid nozzle 310b is omitted because the systems are the same as those for the two-fluid nozzle 310.

The two-fluid nozzles 310, 310b include the inner structures in FIGS. 8 and 9 illustrated in the first embodiment, for example.

(3-c) Further Example of the Configuration of the Edge-Cleaning Unit

Figure 25:
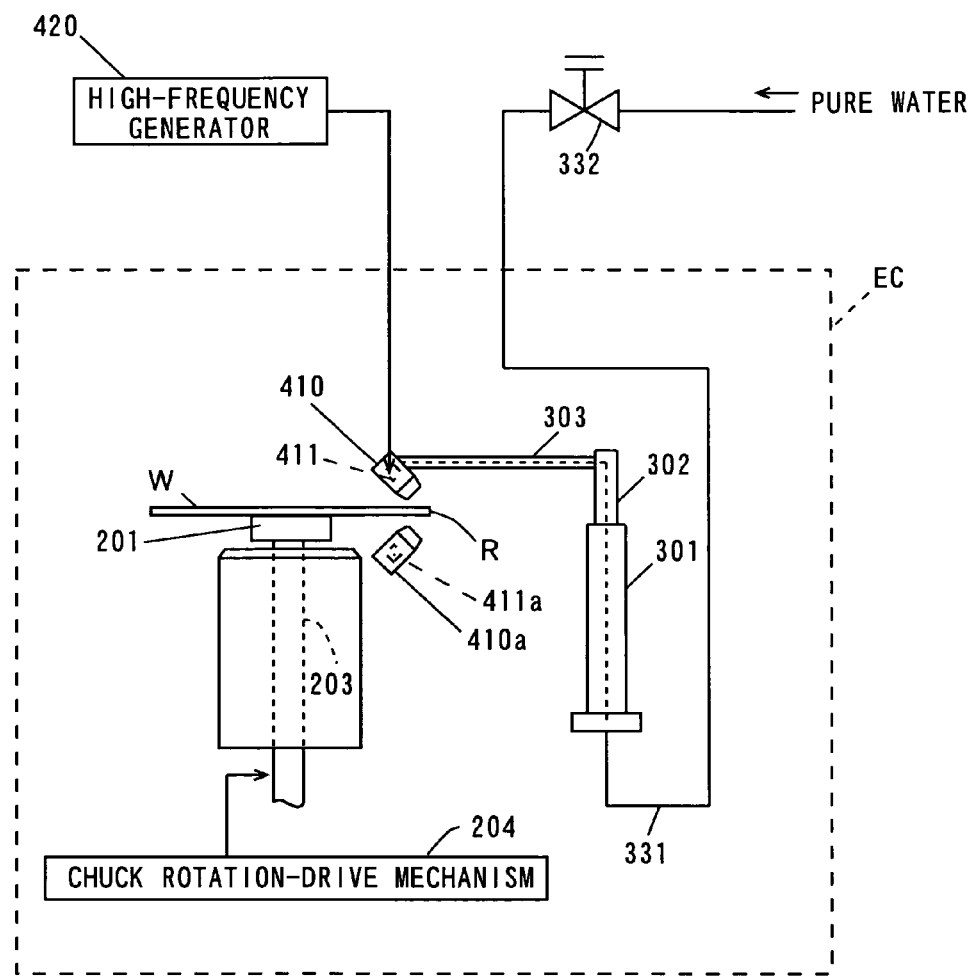
FIG. 25 is a diagram for use in illustrating a further configuration example of the edge-cleaning unit used in the second embodiment.

The edge-cleaning unit EC may further include the following configuration. FIG. 25 is a diagram for use in illustrating a further example of the configuration of the edge-cleaning unit EC used in the second embodiment.

As shown in FIG. 25, the edge-cleaning unit EC of this example has almost the same configuration and operation as those of the edge-cleaning unit EC in FIG. 10 illustrated in the first embodiment.

Therefore, the edge-cleaning unit EC of this example is different from the edge-cleaning unit EC in FIG. 10 as described below.

As shown in FIG. 25, in this example, the ultrasonic nozzle 410 is secured to the end of the arm 303 so as to be inclined outward to the main surface of the substrate W held by the spin chuck 201.

The cleaning liquid supply pipe 331 is connected to the ultrasonic nozzle 410. This causes the immersion liquid as a cleaning liquid to be supplied through the cleaning liquid supply pipe 331 to the ultrasonic nozzle 410 by opening the valve 332.

During the edge-cleaning processing to the substrate W, the immersion liquid is discharged from the ultrasonic nozzle 410 toward the edge R of the substrate W. When the immersion liquid is discharged from the ultrasonic nozzle 410, a high-frequency current is supplied from the high-frequency generator 420 to the high-frequency oscillator 411.

This causes the high-frequency oscillator 411 to produce ultrasonic vibration, which applies high-frequency power to the immersion liquid passing through the ultrasonic nozzle 410 corresponding to the value of the high-frequency current. As a result, the immersion liquid in a state of ultrasonic vibration is discharged to the edge R of the substrate W, thereby cleaning the edge R of the substrate W.

Note that an ultrasonic nozzle 410a having the same configuration and functions as those of the aforementioned ultrasonic nozzle 410 is provided in the edge-cleaning unit EC, similarly to the example of the edge-cleaning unit EC in FIG. 24.

This ultrasonic nozzle 410a is inclined outward so as to be opposite to the back surface of the substrate W held by the spin chuck 201. Note that the ultrasonic nozzle 410a into which a high-frequency oscillator 411a is incorporated is attached to an arm that is not shown.

In this way, the ultrasonic nozzles 410 and 410a are provided so as to be opposite to the upper and back surfaces of the substrate W respectively, thereby making it possible to reliably clean the edge R of the substrate W. Descriptions of each of the supply systems for a cleaning liquid and a high-frequency current for the ultrasonic nozzle 410a are omitted because the systems are the same as those of the ultrasonic nozzle 410.

(4) Cleaning/Drying Processing Unit

The configuration and operations of the cleaning/drying processing unit SD used in the second embodiment is the same as those of the cleaning/drying processing unit SD illustrated in the first embodiment. Therefore, descriptions are omitted.

(5) Interface Transport Mechanism of the Interface Block

Figure 26:
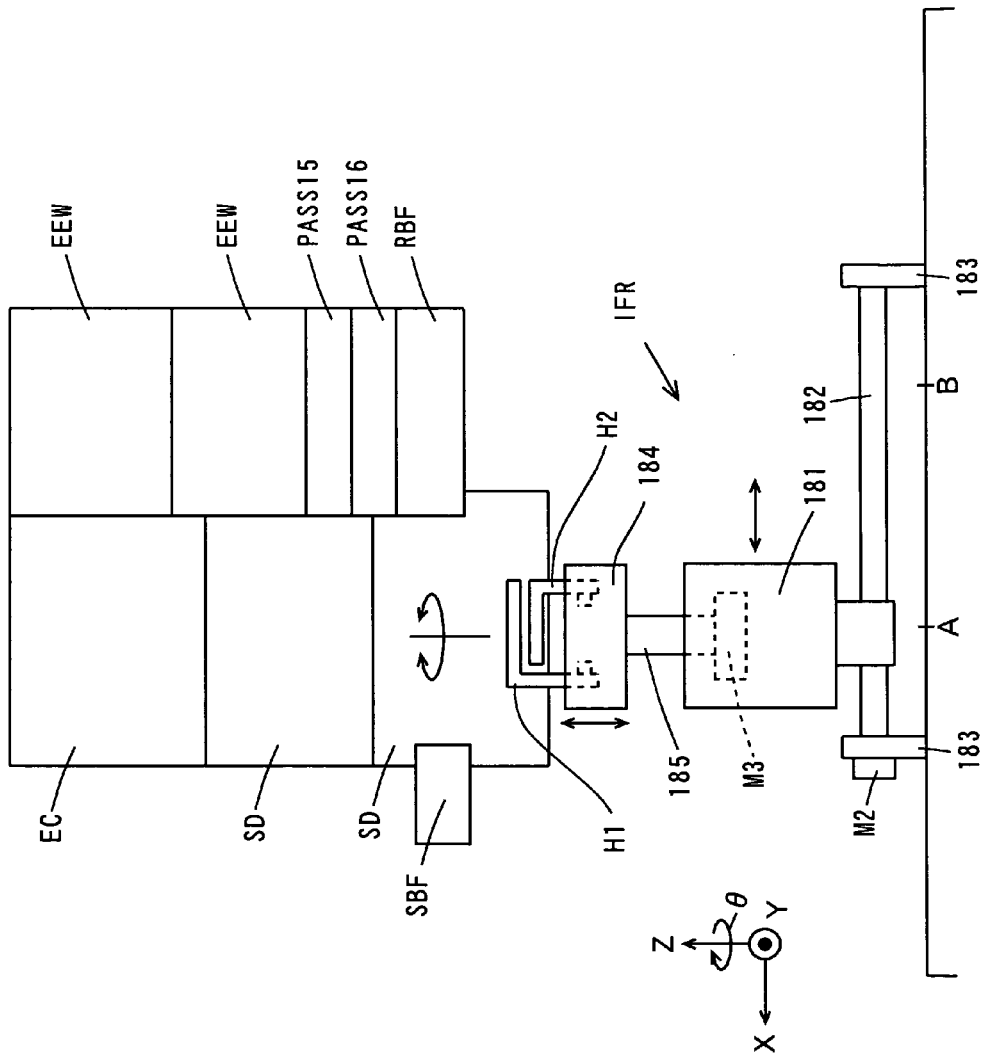
FIG. 26 is a diagram for use in illustrating the configuration and the operation of the interface transport mechanism.

FIG. 26 is a diagram for use in illustrating the configuration and operations of the interface transport mechanism IFR. The configuration and operations of the interface transport mechanism IFR used in this embodiment are the same as those of the interface transport mechanism IFR illustrated in the first embodiment. Therefore, descriptions are omitted.

Note that the edge R of the substrate W before the processing by the exposure device 17 is cleaned by the immersion liquid in the edge-cleaning unit EC in this embodiment, as mentioned above.

(6) Effects According to the Second Embodiment

The substrate processing apparatus 500 according to the second embodiment brings the following effects in addition to the effects of the substrate processing apparatus 500 according to the first embodiment.

(6-a) Effects of the Edge-Cleaning Processing

As mentioned above, the edge R of the substrate W before the exposure processing by the exposure device 17 is cleaned by the immersion liquid in the edge-cleaning unit EC in the edge-cleaning processing group 80. Thus, the components that may be eluted or extracted from one or both of the anti-reflection film and the resist film during the exposure processing by the liquid immersion method are eluted or extracted in the edge-cleaning unit EC in advance and the eluted or extracted component are cleaned away. Therefore, one or both of the anti-reflection film and the resist film are prevented from being eluted or extracted in the immersion liquid when the exposure processing is performed, thereby avoiding contamination of the exposure device 17 (a lens of the exposure device 17). As a result, a defective dimension and a defective shape of the exposure pattern are prevented from being generated.

Note that the component that might be eluted or extracted in the immersion liquid during the exposure processing is not limited to that included in the anti-reflection film and the resist film, and may be a component included in a semiconductor film, a metal film, an insulation film, an organic film or others formed on the substrate W by the external device provided outside the substrate processing apparatus 500 according to this embodiment. It is also possible to elute or extract the components included in these films in the edge-cleaning unit EC in advance.

(6-b) Effects of the Edge-Cleaning Processing Using the Brush

In the edge-cleaning unit EC, where the edge-cleaning processing is applied to the substrate W using the brush 213, the brush 213 is brought into contact directly with the edge R of the substrate W, thereby reliably removing the eluted or extracted component from one or both of the anti-reflection film and the resist film of the edge R of the substrate W.

(7) Modifications of the Substrate Processing Apparatus According to the Second Embodiment and Effects Thereof (7-a) Another Example of the Cleaning Nozzle Used in the Edge-Cleaning Processing Although the cleaning liquid supply paths 241a and 241b, the two-fluid nozzles 310 and 310b and the ultrasonic nozzles 410 and 410a are used in the aforementioned embodiment, a cleaning nozzle provided with a needle-shaped discharge port having a small diameter may be used. In this case, the edge R that is positioned in a small area of the substrate W can be cleaned with a high accuracy.

(7-b) Another Example of Arrangements of the Edge-Cleaning Unit

Although the edge-cleaning processing is applied to the substrate W in the edge-cleaning unit EC in the cleaning/drying processing group 80 of the cleaning/drying processing block 15 in the aforementioned embodiment, the processing may be applied in places besides the cleaning/drying processing group 80 (e.g., the coating unit COV in the coating processing group 60 for resist cover film of the resist cover film processing block 13). This makes it possible to reduce the transportation process to the edge-cleaning unit EC after formation of the resist cover film and to improve throughput.

(7-c) Another Example of Arrangements

Although the resist cover film removal block 14 includes two resist cover film removal processing groups 70a, 70b in the aforementioned embodiment, the resist cover removal block 14 may include a thermal processing group that applies the thermal processing to the substrate W instead of one of the two resist cover film removal processing groups 70a, 70b. In this case, since the thermal processing is applied to a plurality of substrates W effectively, throughput is improved.

(7-d) Another Example of the Cleaning/Drying Processing Unit

Similarly to the first embodiment, the nozzle 650 for cleaning processing and the nozzle 670 for drying processing used in the cleaning/drying processing unit SD may have other structures and perform the cleaning and drying processing corresponding to the structures on the substrate W.

(Correspondence Between Each Constituent Element of the Claims and Each Part of the Embodiment)

(1) Correspondence Between Each Constituent Element of the Claims and Each Part of the First Embodiment According to the first embodiment, the edge-cleaning processing block 9, the anti-reflection film processing block 10, the resist film processing block 11, the development processing block 12, the resist cover film processing block 13, the resist cover film removal block 14 and the cleaning/drying processing block 15 correspond to the processing section; the interface block 16 corresponds to the interface; and the edge-cleaning unit EC in the edge-cleaning processing group 90 corresponds to the first processing unit.

Also, the coating unit BARC in the coating processing group 30 for anti-reflection film, the coating unit RES in the coating processing group 40 for resist film and the coating unit COV in the coating processing group 60 for resist cover film correspond to the second processing unit; and the development processing unit DEV in the development processing group 50, the removal unit REM in the resist cover film removal processing groups 70a and 70b and the cleaning/drying processing unit SD in the cleaning/drying processing group 80 correspond to the third processing unit.

In addition, the interface block 16 corresponds to the interface; the central robot CR1 corresponds to the first transport unit; the edge-cleaning processing block 9 corresponds to the first processing block; the central robots CR2, CR3 and CR5 correspond to the second transport unit; and the anti-reflection film processing block 10, the resist film processing block 11 and the resist cover film processing block 13 correspond to the second processing block.

The central robots CR4, CR6 and CR7 correspond to the third transport unit; the development processing block 12, the resist cover film removal block 14 and the cleaning/drying processing block 15 correspond to the third processing block;

the substrate platform PASS81 corresponds to the first platform; the substrate platform PASS1 corresponds to the second platform; the hand CRH92 corresponds to the first holder; and the hand CRH91 corresponds to the second holder.

In addition, the cleaning/drying processing unit SD in the cleaning/drying processing group 80 corresponds to the drying processing unit; the interface transport mechanism IFR corresponds to the fourth transport unit; the hand H1 corresponds to the third holder; and the hand H2 corresponds to the fourth holder.

Also, the coating unit RES in the coating processing group 40 for resist film corresponds to the photosensitive film formation unit; the coating unit COV in the coating processing group 60 for resist cover film corresponds to the protective film formation unit; the removal unit REM in the resist cover film removal processing groups 70a and 70b corresponds to the removal unit; the coating unit BARC in the coating processing group 30 for anti-reflection film corresponds to the anti-reflection film formation unit; and the development processing unit DEV in the development processing group 50 corresponds to the development processing unit.

(2) Correspondence Between Each Constituent Element of the Claims and Each Part of the Second Embodiment According to the second embodiment, the anti-reflection film processing block 10, the resist film processing block 11, the development processing block 12, the resist cover film processing block 13, the resist cover film removal block 14 and the cleaning/drying processing block 15 correspond to the processing section; and the interface block 16 corresponds to the interface.

Also, according to the aforementioned embodiment, the coating unit RES in the coating processing group 40 for resist film corresponds to the second processing unit; the edge-cleaning unit EC in the edge-cleaning processing group 90 corresponds to the first processing unit; the coating unit COV in the coating processing group 60 for resist cover film corresponds to the third processing unit; the coating unit BARC in the coating processing group 30 for anti-reflection film corresponds to the fourth processing unit; the removal unit REM in the resist cover film removal processing groups 70a and 70b corresponds to the fifth processing unit; the development processing unit DEV in the development processing group 50 corresponds to the sixth processing unit; the interface transport mechanism IFR corresponds to the transport device; and the hands H1 and H2 correspond to the first and second holders respectively.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A substrate processing apparatus that is arranged adjacent to an exposure device, comprising:
    a processing section for applying processing to a substrate; and
    an interface that is provided adjacent to an end of said processing section for exchanging the substrate between said processing section and said exposure device, wherein said processing section includes:
        a first processing unit that cleans an edge of the substrate before the exposure processing by said exposure device; and
        a second processing unit that forms the photosensitive film made of the photosensitive material on the substrate; wherein said first processing unit cleans the edge of the substrate before the exposure processing by said exposure device with a liquid used for the exposure processing by a liquid immersion method.

2. The substrate processing apparatus according to claim 1, wherein said processing section includes
    a third processing unit that applies predetermined processing to the substrate after the exposure processing by said exposure device, and wherein
    said first processing unit cleans the edge of the substrate before the processing by said second processing unit and said second processing unit applies predetermined processing to the substrate before the exposure processing by said exposure device.

3. The substrate processing apparatus according to claim 2, further comprising an indexer that is provided adjacent to another end of said processing section, carries in the substrate to said processing section and carries out the substrate from said processing section, wherein
    said processing section includes
    a first processing block that includes said first processing unit and a first transport unit that transports the substrate,
    one or plurality of second processing blocks that each include said second processing unit and a second transport unit that transports the substrate, and
    one or plurality of third processing blocks that each include said third processing unit and a third transport unit that transports the substrate, and wherein
    said first processing block is arranged adjacent to said indexer.

4. The substrate processing apparatus according to claim 3, wherein said first processing block further includes
    a first platform where the substrate is mounted when the substrate is carried into the first processing block, and
    a second platform where the substrate is mounted when the substrate is carried out of the first processing block, and wherein
    said first transport unit includes first and second holders for holding the substrate, said first transport unit holds
    the substrate with said first holder when transporting the substrate from said first platform to said first processing unit and
    the substrate with said second holder when transporting the substrate from said first processing unit to said second platform.

5. The substrate processing apparatus according to claim 4, wherein said first holder is provided below said second holder.

6. The substrate processing apparatus according to claim 2, wherein said second processing unit includes a photosensitive film formation unit that forms a photosensitive film made of a photosensitive material on the substrate.

7. The substrate processing apparatus according to claim 6, wherein said second processing unit further includes an anti-reflection film formation unit that forms an anti-reflection film on the substrate before formation of said photosensitive film by said photosensitive film formation unit.

8. The substrate processing apparatus according to claim 2, wherein said third processing unit includes a development processing unit that applies development processing to the substrate.

9. The substrate processing apparatus according to claim 1, wherein said first processing unit cleans the edge of the substrate using a brush.

10. The substrate processing apparatus according to claim 1, wherein said first processing unit cleans the edge of the substrate using a two-fluid nozzle.

11. The substrate processing apparatus according to claim 1, wherein said first processing unit cleans the edge of the substrate using an ultrasonic nozzle.

12. The substrate processing apparatus according to claim 1, wherein
said processing section further includes a third processing unit that forms a protective film for protecting the photosensitive film formed by said second processing unit, and
said first processing unit cleans said photosensitive film exposed on the edge of the substrate before said exposure processing using said liquid.

13. The substrate processing apparatus according to claim 1, wherein
said processing section further includes a fourth processing unit that forms an anti-reflection film on the substrate before the formation of said photosensitive film by said second processing unit, and
said first processing unit cleans one or both of said anti-reflection film and said photosensitive film that are exposed on the edge of the substrate before said exposure processing using said liquid.

14. The substrate processing apparatus according to claim 1, wherein said liquid includes at least any one of pure water, glycerol and a mixture liquid of particles with a high refractive index and pure water.

15. The substrate processing apparatus according to claim 14, wherein said particles with a high refractive index include aluminum oxide.

16. The substrate processing apparatus according to claim 1, wherein
said interface includes a transport device that transports the substrate between said processing section and said exposure device, and
said transport device includes first and second holders for holding the substrate,
said transport device holds the substrate with said first holder when transporting the substrate before the exposure processing and
holds the substrate with said second holder when transporting the substrate after the exposure processing.

17. The substrate processing apparatus according to claim 16, wherein said second holder is provided below said first holder.

18. The substrate processing apparatus according to claim 1, wherein said processing section further includes a fifth processing unit that removes said protective film after the exposure processing.

19. The substrate processing apparatus according to claim 1, wherein said processing section further includes a sixth processing unit that applies development processing to the substrate.

20. The substrate processing apparatus according to claim 1, wherein said first processing unit includes a two-fluid nozzle that discharges a fluid mixture of said liquid and a gas to the edge of said substrate.

21. The substrate processing apparatus according to claim 1, wherein said first processing unit includes an ultrasonic nozzle that discharges said liquid to the edge of said substrate while providing an ultrasonic wave to said liquid.

22. A substrate processing apparatus that is arranged adjacent to an exposure device, comprising:
a processing section for applying processing to a substrate;
an interface that is provided adjacent to an end of said processing section for exchanging the substrate between said processing section and said exposure device; and
an indexer that is provided adjacent to another end of said processing section, carries in the substrate to said processing section and carries out the substrate from said processing section, wherein said processing section includes:
a first processing unit that cleans an edge of the substrate before the exposure processing by said exposure device;
a second processing unit that applies predetermined processing to the substrate before the exposure processing by said exposure device,
a third processing unit that applies predetermined processing to the substrate after the exposure processing by said exposure device,
a first processing block arranged adjacent to said indexer and including said first processing unit and a first transport unit that transports the substrate;
one or plurality of second processing blocks that each include said second processing unit and a second transport unit that transports the substrate; and
one or plurality of third processing blocks that each include said third processing unit and a third transport unit that transports the substrate, wherein said first processing unit cleans the edge of the substrate before the processing by said second processing unit and wherein said third processing unit includes a drying processing unit that applies drying processing to the substrate after the exposure processing by said exposure device,
said third processing block including said drying processing unit is arranged adjacent to said interface,
said interface includes a fourth transport unit that transfers the substrate before the exposure processing to said exposure device, transports the substrate after the exposure processing from said exposure device to said drying processing unit and receives the substrate after the drying processing by said drying processing unit.

23. The substrate processing apparatus according to claim 22, wherein
said fourth transport unit includes third and fourth holders for holding the substrate, said fourth transport unit holds
the substrate with said third holder when transferring the substrate before the exposure processing to said exposure device and when receiving the substrate after the drying processing by said drying processing unit, and
the substrate with said fourth holder when transporting the substrate after the exposure processing from said exposure device to said drying processing unit.

24. The substrate processing apparatus according to claim 23, wherein said fourth holder is provided below said third holder.

25. A substrate processing apparatus that is arranged adjacent to an exposure device, comprising:
a processing section for applying processing to a substrate; and
an interface that is provided adjacent to an end of said processing section for exchanging the substrate between said processing section and said exposure device, wherein said processing section includes:
a first processing unit that cleans an edge of the substrate before the exposure processing by said exposure device;
a second processing unit that includes a photosensitive film formation unit that forms a photosensitive film made of a photosensitive material on the substrate and a protective film formation unit that forms a protective film for protecting said photosensitive film and applies predetermined processing to the substrate before the exposure processing by said exposure device; and
a third processing unit that applies predetermined processing to the substrate after the exposure processing by said exposure device, and wherein said first processing unit cleans the edge of the substrate before the processing by said second processing unit.

26. The substrate processing apparatus according to claim 25, wherein said third processing unit further includes a removal unit that removes said protective film after the exposure processing by said exposure device.

* * * * *

UNITED STATES PATENT AND TRADEMARK OFFICE
CERTIFICATE OF CORRECTION

PATENT NO.      : 7,604,424 B2                                Page 1 of 1
APPLICATION NO. : 11/472780
DATED           : October 20, 2009
INVENTOR(S)     : Shigemori et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 701 days.

Signed and Sealed this

Fifth Day of October, 2010

David J. Kappos
*Director of the United States Patent and Trademark Office*